(12) United States Patent
Liaw

(10) Patent No.: US 12,414,282 B2
(45) Date of Patent: Sep. 9, 2025

(54) SEMICONDUCTOR DEVICE

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 444 days.

(21) Appl. No.: 18/149,402

(22) Filed: Jan. 3, 2023

(65) Prior Publication Data

US 2024/0224489 A1    Jul. 4, 2024

(51) Int. Cl.
*H10B 10/00* (2023.01)
(52) U.S. Cl.
CPC ................................. *H10B 10/125* (2023.02)
(58) Field of Classification Search
CPC ....... H10B 10/125; H10B 10/12; H10D 89/10
USPC .................................................... 365/185.07
See application file for complete search history.

(56) References Cited

U.S. PATENT DOCUMENTS

| | | |
|---|---|---|
| 8,009,463 B2 | 8/2011 | Liaw |
| 8,189,368 B2 * | 5/2012 | Liaw .................... H10D 86/011 365/230.05 |
| 8,315,084 B2 | 11/2012 | Liaw et al. |
| 8,675,397 B2 | 3/2014 | Liaw |
| 8,995,176 B2 | 3/2015 | Liaw |
| 9,099,172 B2 | 8/2015 | Liaw |
| 9,209,247 B2 | 12/2015 | Colinge et al. |
| 9,236,267 B2 | 1/2016 | De et al. |
| 9,373,386 B2 | 6/2016 | Liaw |
| 9,412,817 B2 | 8/2016 | Yang et al. |
| 9,412,828 B2 | 8/2016 | Ching et al. |
| 9,418,728 B2 | 8/2016 | Liaw |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |

(Continued)

OTHER PUBLICATIONS

U.S. Appl. No. 17/671,288, filed Feb. 14, 2022.

*Primary Examiner* — Fernando Hidalgo
(74) *Attorney, Agent, or Firm* — Cooper Legal Group, LLC

(57) ABSTRACT

Semiconductor devices with dual-port memory cells are provided. First inverter includes first pull-up transistor, and first and second pull-down transistors connected in parallel. Second inverter includes second pull-up transistor, and third and fourth pull-down transistors connected in parallel. First and second pass-gate transistors are coupled to the first inverter to form a first port. Third and fourth pass-gate transistors are coupled to the second inverter to form a second port. First and second pass-gate transistors and the first and third pull-down transistors share first continuous active region. The third and fourth pass-gate transistors and the second and fourth pull-down transistors share a second continuous active region. The first and second pull-up transistors and first and second isolation transistors share a third continuous active region. Gates of the first and second isolation transistors are electrically connected to VDD line. Sources of the first and second isolation transistors are floating.

20 Claims, 26 Drawing Sheets

(56) References Cited

U.S. PATENT DOCUMENTS

| | | |
|---|---|---|
| 9,608,116 B2 | 3/2017 | Ching et al. |
| 9,613,953 B2 | 4/2017 | Liaw |
| 9,646,974 B1 | 5/2017 | Liaw |
| 9,773,545 B2 | 9/2017 | Liaw |
| 9,793,273 B2 | 10/2017 | Liaw |
| 9,805,985 B2 | 10/2017 | Liaw |
| 9,824,747 B2 | 11/2017 | Liaw |
| 9,858,985 B2 * | 1/2018 | Liaw ........................ G11C 8/16 |
| 9,916,893 B2 | 3/2018 | Liaw |
| 10,170,480 B2 | 1/2019 | Liaw |
| 2002/0181273 A1 * | 12/2002 | Nii ........................ G11C 11/412 |
| | | 365/154 |
| 2011/0222332 A1 * | 9/2011 | Liaw ..................... H10B 10/12 |
| | | 365/156 |
| 2015/0009750 A1 * | 1/2015 | Schaefer ................ H10B 10/00 |
| | | 365/156 |
| 2019/0206469 A1 * | 7/2019 | Trinh Quang ...... G11C 11/1673 |
| 2020/0027869 A1 * | 1/2020 | Yeh ........................ H10B 10/00 |
| 2021/0202498 A1 * | 7/2021 | Liaw ................ H01L 21/02603 |
| 2023/0013845 A1 * | 1/2023 | Liaw ..................... H10D 89/10 |

\* cited by examiner

SEMICONDUCTOR DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Static Random Access Memory (SRAM) is commonly used in integrated circuits. SRAM cells have the advantageous feature of being able to hold data without the need to refresh. With the increasingly demanding requirements on the speed of integrated circuits, the read speed and write speed of SRAM cells have also become more important. With increased down-scaling of the already very small SRAM cells, however, such requests are difficult to achieve.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
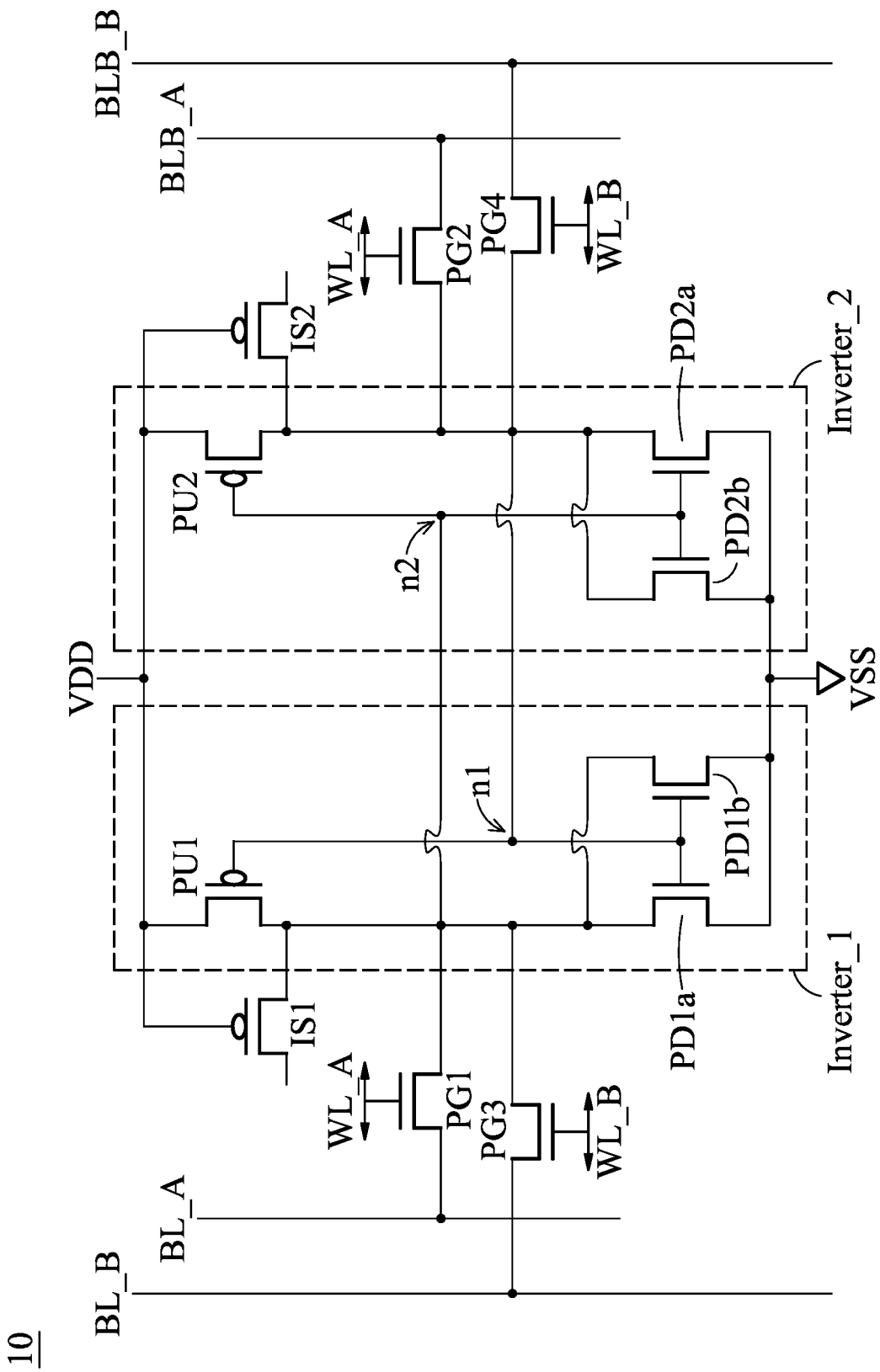
FIG. 1 shows a memory cell, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

In an IC, each memory includes multiple memory cells arranged in multiple rows and multiple columns of a memory array. In some embodiments, the memory cells have the same circuit configuration and the same semiconductor structure. In some embodiments, the memory cell may be a bit cell of SRAM.

FIG. 1 shows a memory cell 10, in accordance with some embodiments of the disclosure. In this embodiment, the memory cell 10 is a dual-port (DP) SRAM bit cell. The dual-port SRAM device formed by the dual-port SRAM bit cells allows parallel operation, such as 1R (read), 1 W (write), or 2R (read) in one cycle, and therefore has higher bandwidth than a single port SRAM device.

The memory cell 10 includes a pair of cross-coupled inverters Inverter-1 and Inverter-2, a first port (port-A), a second port (port-B), and two isolation transistors IS1 and IS2. The inverters Inverter-1 and Inverter-2 are cross-coupled between the data nodes n2 and n1, and form a latch circuit.

The first port includes the pass-gate transistors PG1 and PG2, and the second port includes the pass-gate transistors PG3 and PG4. The pass-gate transistor PG1 is coupled between a bit line BL_A and the data node n2, and the pass-gate transistor PG2 is coupled between a complementary bit line BLB_A and the data node n1, wherein the complementary bit line BLB_A is complementary to the bit line BL_A. The gates of the pass-gate transistors PG1 and PG2 are coupled to the word line WL_A. The pass-gate transistor PG3 is coupled between a bit line BL_B and the data node n2, and the pass-gate transistor PG4 is coupled between a complementary bit line BLB_B and the data node n1, wherein the complementary bit line BLB_B is complementary to the bit line BL_B. The gates of the pass-gate transistors PG3 and PG4 are coupled to the word line WL_B.

The drain of the isolation transistor IS1 is coupled to the data node n2, and the source of the isolation transistor IS1 is floating. Moreover, the drain of the isolation transistor IS2 is coupled to the data node n1, and the source of the isolation transistor IS2 is floating. The gates of the isolation transistors IS1 and IS2 are coupled to the supply voltage VDD. In such embodiment, the isolation transistors IS1 and IS2 are formed without extra cost or area for the memory cells.

The inverter Inverter-1 includes a pull-up transistor PU1 and the pull-down transistors PD1$a$ and PD1$b$, and the pull-down transistors PD1$a$ and PD1$b$ are connected in parallel. The drain of the pull-up transistor PU1 and the drains of the pull-down transistors PD1$a$ and PD1$b$ are coupled to the data node n2 connecting the pass-gate transistors PG1 and PG3. The gates of the pull-up transistor PU1 and the pull-down transistors PD1$a$ and PD1$b$ are coupled to the data node n1 connecting the pass-gate transistors PG2 and PG4. Furthermore, the source of the pull-up transistor PU1 is coupled to the power supply VDD, and the sources of the pull-down transistors PD1$a$ and PD1$b$ are coupled to a ground VSS.

The inverter Inverter-2 includes a pull-up transistor PU2 and the pull-down transistors PD2$a$ and PD2$b$, and the pull-down transistors PD2$a$ and PD2$b$ are connected in parallel. The drain of the pull-up transistor PU2 and the drains of the pull-down transistors PD2$a$ and PD2$b$ are coupled to the data node n1 connecting the pass-gate transistors PG2 and PG4. The gates of the pull-up transistor PU2 and the pull-down transistors PD2$a$ and PD2$b$ are coupled to the data node n2 connecting the pass-gate transistors PG1 and PG3. Furthermore, the source of the pull-up transistor PU2 is coupled to the power supply VDD, and the sources of the pull-down transistors PD2$a$ and PD2$b$ are coupled to a ground VSS.

The drain of the isolation transistor IS1 is coupled to the data node n2, and the drain of the isolation transistor IS2 is coupled to the data node n1. The sources of the isolation transistors IS1 and IS2 are depicted as floating. In some embodiments, the sources of the isolation transistors IS1 and IS2 may be coupled to respective isolation transistors IS1/IS2 in adjacent memory cells 10. The gates of the isolation transistors IS1 and IS2 are coupled to the power supply VDD, thus the isolation transistors IS1 and IS2 are turned off by the power supply VDD.

In the memory cell 10, the pass-gate transistors PG1, PG2, PG3 and PG4 and the pull-down transistors PD1$a$, PD1$b$, PD2$a$ and PD2$b$ are N-type transistors, and the pull-up transistors PU1 and PU2 and the isolation transistors IS1 and IS2 are P-type transistors. The P-type transistors and the N-type transistors are formed by the MOSFET devices including bulk planar MOSFETs, or bulk fin-structure (3D) MOSFETs, or bulk multiple-fin MOSFETs in one device, or SOI planar MOSFETs, or SOI fin-structure (3D) MOSFETs, or SOI multiple-fin MOSFETs in one device, or nano-wire gate all around (GAA) MOSFETs, or nano-sheet GAA MOSFETs, or vertically stacked multiple channels (sheets) GAA MOSFETs, or combination thereof.

The nanostructure transistor (e.g. nanosheet transistor, nanowire transistor, multi-bridge channel, nano-ribbon FET, GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 2:
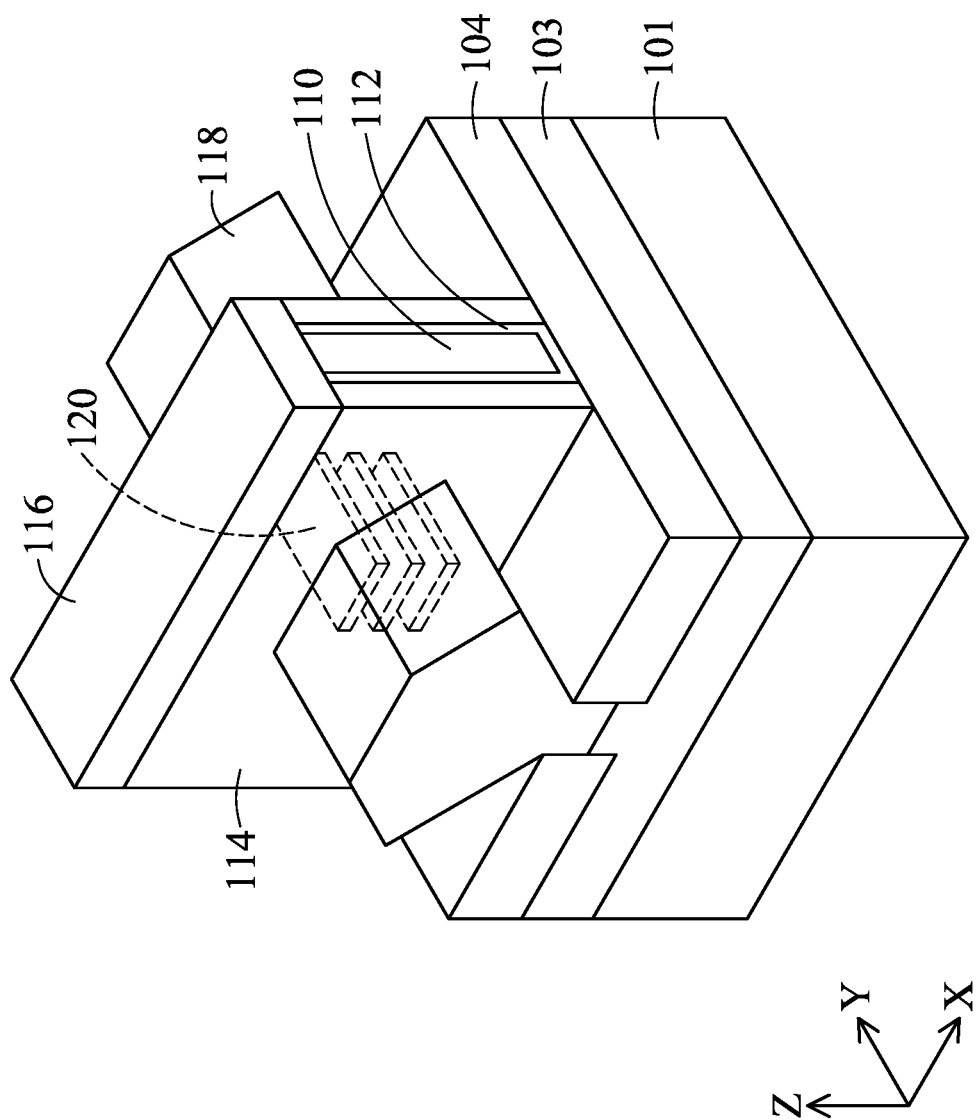
FIG. 2 shows a perspective view of an exemplary GAA transistor.

FIG. 2 shows a perspective view of an exemplary GAA transistor. The GAA transistor includes a substrate 101. The substrate 101 may contains a semiconductor material, such as bulk silicon (Si). In some other embodiments, the substrate 101 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 101 may also include an insulating layer, such as a silicon oxide layer, to have a silicon-on-insulator (SOI) structure or a germanium-on-insulator (GOI) structure. In some embodiments, after the resultant GAA transistor is formed, the substrate 101 may be removed by a suitable process (e.g., a chemical mechanical polishing (CMP) process) for forming back-side interconnections.

The GAA transistor also includes one or more nanostructures 120 (dash lines) extending in the Y-direction and vertically arranged (or stacked) in a Z-direction. More specifically, the nanostructures 120 are spaced from each other in the Z-direction. In some embodiments, the nanostructures 120 may also be referred to as channels, channel layers, nanosheets, or nanowires. The nanostructures 120 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 120 include silicon for N-type GAA transistors. In other embodiments, the nanostructures 120 include silicon germanium for P-type GAA transistors. In some embodiments, the nanostructures 120 are all made of silicon, and the type of GAA transistors depend on work function metal layer wrapping around the nanostructures 120.

The GAA transistor further includes a gate structure including a gate electrode 110 and a gate dielectric layer 112. The gate dielectric layer 112 wraps around the nanostructures 120 and the gate electrode 110 wraps around the gate dielectric layer 112 (not shown). The gate electrode 110 may include polysilicon or work function metal. The work function metal includes TiN, TaN, TiAl, TiAlN, TaAl, TaAlN, TaAlC, TaCN, WNC, Co, Ni, Pt, W, combinations thereof, or other suitable material.

In some embodiments, the gate electrode 110 may include a capping layer, a barrier layer, an n-type work function metal layer, a p-type work function metal layer, and a fill material (not shown). In some embodiments, the P-type transistors and the N-type transistors are formed by the same work function material. In some embodiments, the P-type transistors and the N-type transistors are made of different work function materials.

The gate dielectric layer 112 may include dielectric materials, such as silicon oxide, silicon nitride, silicon oxynitride, dielectric material(s) with high dielectric constant (high-k), or a combination thereof. Examples of high-k dielectric materials include $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

The gate spacers 114 are on sidewalls of the gate dielectric layer 112 and over the nanostructures 120 (not shown). The gate spacers 114 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 114 may include a single layer or a multi-layer structure.

The gate top dielectric layer 116 is over the gate dielectric layer 112, the gate electrode 110, and the nanostructures 120. The gate top dielectric layer 116 is used for contact etch protection layer. The material of gate top dielectric layer 116 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material. The thickness of the gate top dielectric layer 116 about 2 nm to about 60 nm.

The GAA transistor further includes epitaxially-grown materials 118. As shown in FIG. 2, two epitaxially-grown materials 118 are on opposite sides of the gate structure. The epitaxially-grown materials 118 serve as the source/drain features of the GAA transistor. Therefore, the epitaxially-grown materials 118 may also be referred to as source/drain, source/drain features, or source/drain nodes. In some embodiments, for an N-type GAA transistor, the epitaxially-grown materials 118 may include SiP, SiC, SiPC, SiAs, Si, or a combination thereof. In some embodiments, for a P-type GAA transistor, the epitaxially-grown materials 118 may include SiGe, SiGeC, Ge, Si, a boron-doped SiGe, boron and carbon doped SiGe, or a combination thereof.

The nanostructures 120 (dash lines) extends in the Y-direction to connect two epitaxially-grown materials 118. Such the nanostructures 120 and the epitaxially-grown materials 118 connected continuously with each other may be collectively referred to as an active area.

Isolation feature 104 is over the substrate 101 and under the gate dielectric layer 112, the gate electrode 110, and the gate spacers 114. The isolation feature 104 is used for isolating the GAA transistor from other devices. In some embodiments, the isolation feature 104 may include different structures, such as shallow trench isolation (STI) structure, deep trench isolation (DTI) structure. Therefore, the isolation feature 104 is also referred as to as a STI feature or DTI feature.

Figure 3:
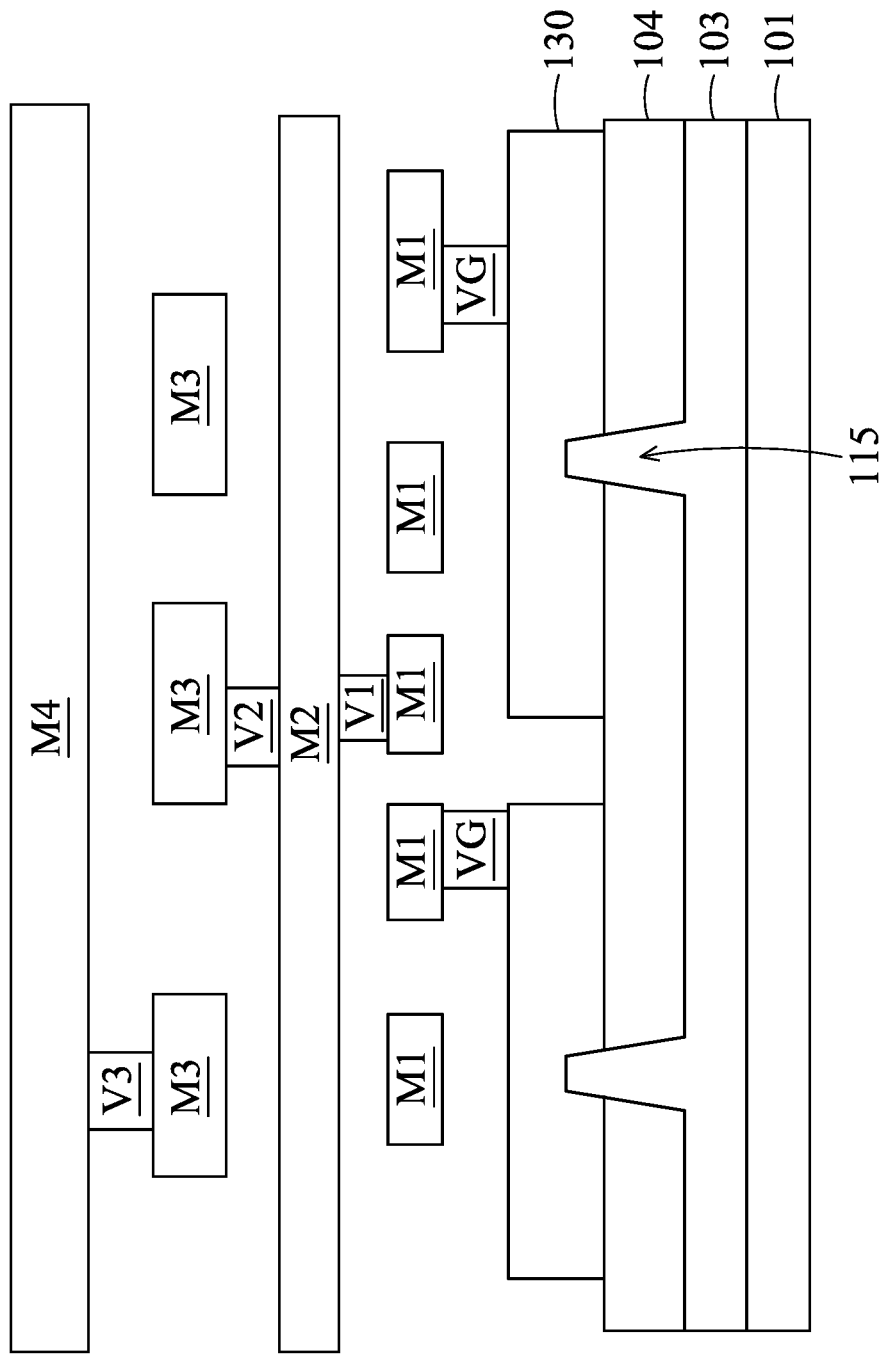
FIG. 3 shows a cross sectional view of a semiconductor device, in accordance with some embodiments of the disclosure.

FIG. 3 shows a cross sectional view of a semiconductor device, in accordance with some embodiments of the disclosure. In the semiconductor device, one or more memory cells 10 as illustrated in the disclosure are formed. In such embodiment, the memory cells 10 includes the FinFET transistors. Furthermore, some components of the semiconductor device are not depicted for clarity of FIG. 3.

The semiconductor device includes a well region 103 over the substrate 101. In some embodiments, the well region 103 is a P-type well region, and the material of the P-type well region includes Si with Boron (B) doping. In some embodiments, the well region 103 is an N-type well region, and the material of the N-type well region includes Si with Phosphorus (P) doping. The fins 115 form the active regions over the well region 103, and the gate structures 130 are formed over the fins 115.

The gate vias VG are formed over and connected to the gate structures 130 (e.g., the gate structures). Isolation feature 104 is over the well region 103 and under the gate structure 130. The isolation feature 104 is used for isolating the fin 115 of a transistor from other devices. In some embodiments, the isolation feature 104 may include different structures, such as shallow trench isolation (STI) structure, deep trench isolation (DTI) structure. Therefore, the isolation feature 104 is also referred as to as a STI feature or DTI feature.

The semiconductor device further includes the vias V1, V2, and V3 and the metal lines M1, M2, M3 and M4 in an inter-metal dielectric (IMD). In some embodiments, the IMD may be multilayer structure, such as one or more dielectric layers. The metal lines M1, M2, M3 and M4 are formed in respective conductive layers, which are also referred to as metal layers. Moreover, the vias VG, V0 (not shown), V1, V2, and V3 are formed in respective via layers over the gate structures 130.

In FIG. 3, the conductive layers of the semiconductor device include a first metal layer having first conductive features (e.g., the metal lines M1), a second metal layer having second conductive features (e.g., the metal lines M2), a third metal layer having third conductive features (e.g., the metal lines M3), and a fourth metal layer having fourth conductive features (e.g., the metal lines M4). The first metal layer is the lowest metal layer.

The via layers of semiconductor device include a base via layer having the vias V0 (not shown) and the vias VG, a first via layer having the vias V1, a second via layer having the vias V2, and a third via layer having the vias V3. The vias V0 and the vias VG are arranged to connect at least some of the conductive structures (contacts) and the gate structures 130 with corresponding first metal lines M1. The vias V1 are arranged to connect at least some first metal lines M1 with the corresponding second metal lines M2. The vias V2 are arranged to connect at least some second metal lines M2 with the corresponding third metal lines M3. The vias V3 are arranged to connect at least some third metal lines M3 with the corresponding fourth metal lines M4.

FIG. 3 is used as to demonstrate the spatial relationship among various metal layers and via layers. In some embodiments, the numbers of conductive features at various layers are not limited to the example depicted in FIG. 3. In some embodiments, there are one or more metal layers and one or more via layers over the fourth metal lines M4.

Figure 4A:
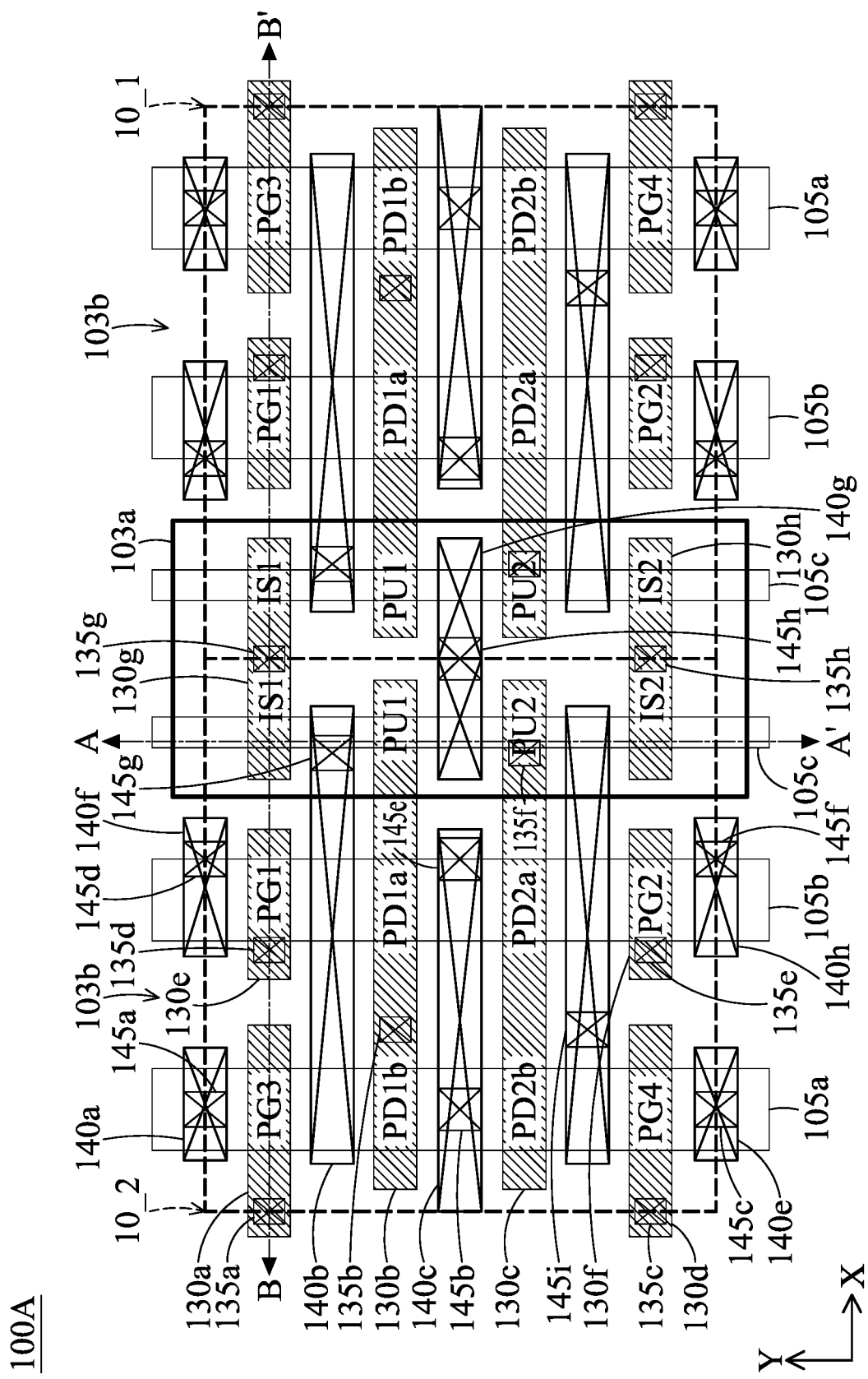
FIG. 4A shows a top view of the memory cells in a semiconductor device, with depictions of the components under the first metal layer of FIG. 3, in accordance with some embodiments of the disclosure.
Figure 4B:
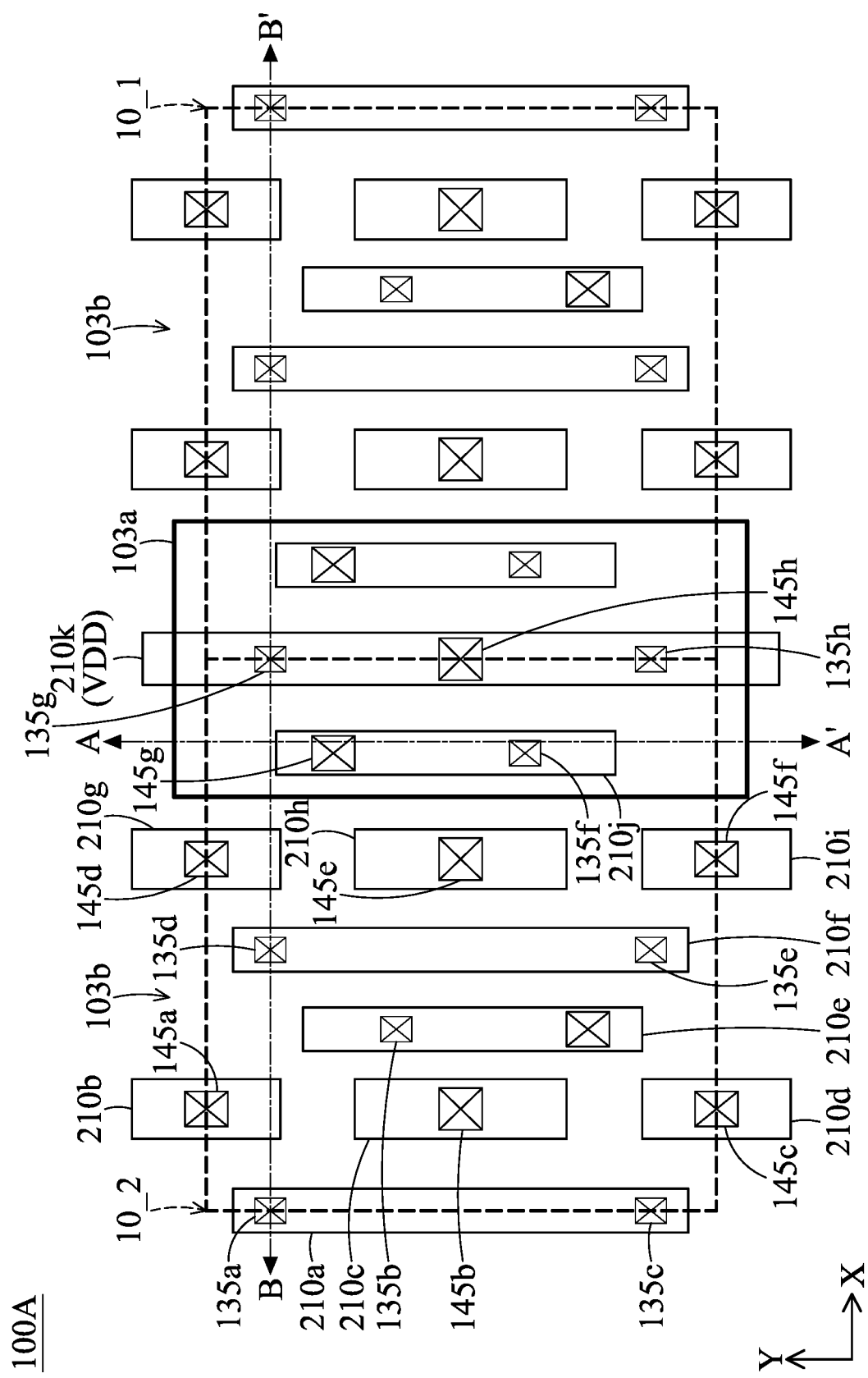
FIG. 4B shows a top view of the memory cells of FIG. 4A, with depictions of the components in the first metal layer.
Figure 4C:
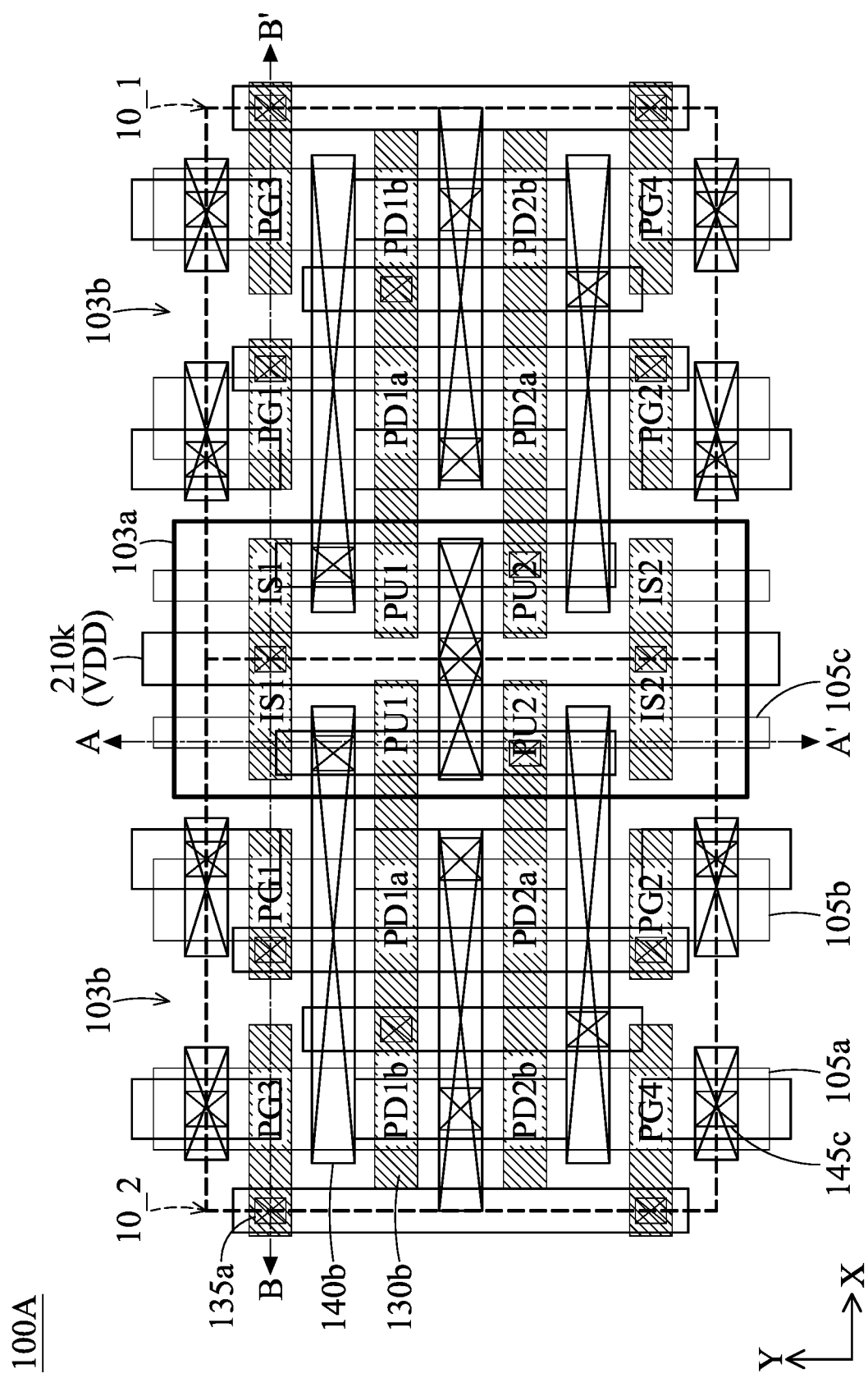
FIG. 4C shows a top view of the memory cells of FIG. 4A, with depictions of the components under and in the first metal layer.

FIG. 4A shows a top view of the memory cells 10_1 and 10_2 in a semiconductor device 100A, with depictions of the components under the first metal layer of FIG. 3, in accordance with some embodiments of the disclosure. FIG. 4B shows a top view of the memory cells 10_1 and 10_2 of FIG. 4A, with depictions of the components in the first metal layer. FIG. 4C shows a top view of the memory cells 10_1 and 10_2 of FIG. 4A, with depictions of the components under and in the first metal layer.

In FIGS. 4A through 4C, the same components in the memory cells 10_1 and 10_2 are given the same reference numbers, and the detailed description thereof is thus omitted. Furthermore, the memory cells 10_1 and 10_2 are arranged in the same row of the memory array, and the memory cell 10_1 is in contact with the adjacent memory cell 10_2.

The memory cells 10_1 and 10_2 are an implementation of the dual-port memory cell 10 depicted in FIG. 1. That is, each of the memory cells 10_1 and 10_2 is a 12T SRAM cell with twelve (12) transistors, including two pass-gate transistors PG1 and PG2 of the first port, two pass-gate transistors PG3 and PG4 of the second port, two pull-up transistors PU1 and PU2, fourth pull-down transistors PD1*a*, PD1*b*, and PD2*a* and PD2*b*, and two isolation transistors IS1 and IS2. In such embodiment, the transistors in the memory cells 10_1 and 10_2 are gate-all-around field effect transistors (GAA FETs). The boundaries of the memory cells 10_1 and 10_2 are indicated by dashed lines.

The memory cells 10_1 and 10_2 are joined along a center line extending along the Y-direction. In other words, the memory cells 10_1 and 10_2 are arranged in mirror symmetry along the Y-direction. It is noted that the illustration of the cells 10_1 and 10_2 is for the purposes of demonstrating the highly symmetric nature of the SRAM cells of the present disclosure and how two adjacent SRAM cells share the same N-type well region 103*a*. Thus, cell stability and device matching are improved, so as to increase the chip speed and achieve lower power supply for the memory device.

Each of the SRAM cells 10_1 and 10_2 includes a cell height H1 along the Y direction and a cell width W1 along the X direction. In such embodiment, the cell height H1 spans over a total of 4 gate structures and is measured at about 4 gate pitches. Each gate pitch includes a gate length along the Y direction and a gate spacing between two adjacent gate structures along the Y direction.

In each of the memory cells 10_1 and 10_2, the 12 transistors are formed upon 3 continuous active regions (or oxide definition (OD) regions). Furthermore, each of the memory cells 10_1 and 10_2 includes a substrate (not labeled) having the P-type well region 103*b* and the N-type well region 103*a*. Each of the memory cells 10_1 and 10_2 includes the active regions 105*a*, 105*b* and 105*c* extending along the Y direction. The active regions 105*a* and 105*b* are formed in the P-type well region 103*b*, and the active region 105*c* is formed in the N-type well region 103*a*. In some embodiments, the active regions 105*a*, 105*b* and 105*c* are formed by single fin or multiple fins.

As described above, the memory cells 10_1 and 10_2 have a symmetrical configuration. To simplify the description, only the memory cell 10_2 is used for description.

In the memory cell 10_2, the gate structure 130*a* engages the active region 105*a* to form the pass-gate transistor PG3. The gate structure 130*b* engages the active region 105*a* to form the pull-down transistor PD1*b*. The gate structure 130*c* engages the active region 105*a* to form the pull-down transistor PD2*b*. The gate structure 130*d* engages the active region 105*a* to form the pass-gate transistor PG4. The gate structures 130*a* and 130*d* are electrically connected to the metal line 210*a* through the gate vias 135*a* and 135*c*, respectively.

Furthermore, the gate structure 130*e* engages the active region 105*b* to form the pass-gate transistor PG1. The gate structure 130*b* engages the active region 105*b* to form the pull-down transistor PD1*a*. The gate structure 130*c* engages the active region 105*b* to form the pull-down transistor PD2*a*. The gate structure 130*f* engages the active region 105*b* to form the pass-gate transistor PG2. The gate structures 130*e* and 130*f* are electrically connected to the metal line 210*f* through the gate vias 135*d* and 135*e*, respectively.

Moreover, the gate structure 130*g* engages the active region 105*c* to form the isolation transistor IS1. The gate structure 130*b* engages the active region 105*c* to form the pull-up transistor PU1. The gate structure 130*c* engages the active region 105*c* to form the pull-up transistor PU2. The gate structure 130*h* engages the active region 105*c* to form the isolation transistor IS2. The gate structures 130*g* and 130*h* are electrically connected to the metal line 210*k* through the gate vias 135*g* and 135*h*, respectively.

In the semiconductor device 100A, the gate structures 130*g* and 130*h* are shared by the memory cells 10_1 and 10_2. Furthermore, in each of the memory cells 10_1 and 10_2, the pull-down transistors PD1*a* and PD1*b* and the pull-up transistor PU1 share the gate structure 130*b*, and the pull-down transistors PD2*a* and PD2*b* and the pull-up transistor PU2 share the gate structure 130*c*. Furthermore, the gate structure 130*b* corresponds to the data node n2, and the gate structure 130*c* corresponds to the data node n1.

The pull-up transistors PU1 and PU2 are formed in the continuous active region 105*c*, so as to improve device mismatch and Ion (turned-on current) boost and avoid length of diffusion (LOD) effect for the pull-up transistors PU1 and PU2. Compared with the discontinuous active region, the semiconductor device 100A has lower N-Well resistance for soft error rate (SER) and latch up performance improvement. Thus, N-well strapping frequency of the semiconductor device 100A can extend to decrease the memory array area.

In the memory cells 10_1 and 10_2, the pull-down transistors PD1*b* and PD2*b* are disposed between the pass-gate transistors PG3 and PG4 on the P-type well region 103*b*, and the pull-down transistors PD1*a* and PD2*a* are disposed between the pass-gate transistors PG1 and PG2 on the P-type well region 103*b*. Furthermore, the pull-up transistors PU1 and PU2 are disposed between the isolation transistors IS1 and IS2 on the N-type well region 103*a*.

In the memory cell 10_2, the source/drain contacts 140*a* through 140*h* and the gate structures 130*a* through 130*h* extend in the X-direction. The metal lines 210*a* through 210*k* are formed in the first metal layer and extend in the Y direction. The source/drain contacts 140*a* through 140*h* are configured to connect the source/drain regions of the transistors. Source/drain region(s) may refer to a source or a drain, individually or collectively dependent upon the context.

In the memory cell 10_2, the source/drain contacts 140*a* and 140*b* overlap the active region 105*a* and correspond to source and drain of the pass-gate transistor PG3. The source/drain contact 140*a* is electrically connected to the metal line 210*b* through the via 145*a*. Furthermore, the source/drain contacts 140*b* and 140*c* overlap the active region 105*a* and correspond to the drain and source of the pull-down transistor PD1*b*. The source/drain contact 140*b* is electrically connected to the gate structure 130*c* through the via 145*g*, the metal line 210*j*, and the gate via 135*f* in sequence. The metal line 210*j* is a local connection line configured to form an electrical connection between the source/drain contact 140*b* and the gate structure 130*c*. The source/drain contact 140*c* is electrically connected to the metal lines 210*c* and 210*h* through the via 145*b* and 145*e*, respectively. The source/drain contacts 140*d* and 140*c* overlap the active region 105*a* and correspond to the drain and source of the pull-down transistor PD2*b*. The source/drain contact 140*d* is electrically connected to the gate structure 130*b* through the via 145*i*, the metal line 210*e*, and the gate via 135*b* in sequence. The metal line 210*e* is a local connection line configured to form an electrical connection between the source/drain contact 140*d* and the gate structure 130*b*. The source/drain contacts 140*d* and 140*e* overlap the active region 105*a* and correspond to source and drain of the pass-gate transistor PG4. The source/drain contact 140*e* is electrically connected to the metal line 210*d* through the via 145*c*.

The source/drain contacts 140*f* and 140*b* overlap the active region 105*b* and correspond to source and drain of the pass-gate transistor PG1. The source/drain contact 140*f* is electrically connected to the metal line 210*g* through the via 145*d*. Furthermore, the source/drain contacts 140*b* and 140*c* overlap the active region 105*b* and correspond to the drain and source of the pull-down transistor PD1*a*. The source/drain contacts 140*d* and 140*c* overlap the active region 105*a* and correspond to the drain and source of the pull-down transistor PD2*a*. The source/drain contacts 140*d* and 140*h* overlap the active region 105*b* and correspond to source and drain of the pass-gate transistor PG2. The source/drain contact 140*h* is electrically connected to the metal line 210*i* through the via 145*f*.

The source/drain contact 140*b* overlaps the active region 105*c* and correspond to drain of the isolation transistor IS1. Furthermore, the source/drain contacts 140*b* and 140*g* overlap the active region 105*c* and correspond to the drain and source of the pull-up transistor PU1. The source/drain contact 140*g* is electrically connected to the metal line 210*k* through the via 145*h*. The source/drain contacts 140*d* and 140*g* overlap the active region 105*c* and correspond to the drain and source of the pull-up transistor PU2. The source/drain contact 140*d* overlaps the active region 105*c* and correspond to drain of the isolation transistor IS2.

In the semiconductor device 100A, the source/drain contact 140*b* is a longer contact electrically connected the drains of the pass-gate transistors PG1 and PG3, the pull-down transistors PD1*a* and PD1*b*, the pull-up transistor PU1 and the isolation transistor IS1. Similarly, the source/drain contact 140*d* is a longer contact electrically connected the drains of the pass-gate transistors PG2 and PG4, the pull-down transistors PD2*a* and PD2*b*, the pull-up transistor PU2 and the isolation transistor IS2.

As described above, the memory cell 10_1 has a configuration mirrored-identical to the memory cell 10_2. Thus, the configuration of the metal lines and the source/drain contacts of the twelve transistors in the memory cell 10_1 is similar to that of the twelve transistors in the memory cell 10_2.

The metal line 210*k* functions as the VDD line (or VDD conductor) for the memory cells 10_1 and 10_2. In this embodiment, the VDD line is shared by the memory cells 10_1 and 10_2. For example, the metal line 210*k* is disposed at the right boundary of the memory cell 10_2. Moreover, the memory cells arranged in the same columns as memory cells 10_1 and 10_2 share the same VDD line through the metal line 210*k*.

The metal line 210*d* functions as a landing pad (or a landing line) of the complementary bit line BLB_B for the memory cell 10_2, and the metal line 210*i* functions as a landing pad of the complementary bit line BLB_A for the memory cell 10_2. The landing pads of the complementary bit lines BLB_A and BLB_B are shared by the memory cell adjacent to the memory cell 10_2 in the same column. For example, the metal lines 210*d* and 210*i* are disposed at the bottom boundary of the memory cell 10_2. The metal line 210*b* functions as a landing pad of the bit line BL_B for the memory cell 10_2, and the metal line 210*g* functions as a landing pad of the bit line BL_A for the memory cell 10_2. The landing pads of the bit lines BL_A and BL_B are shared by the memory cell adjacent to the memory cell 10_2 in the same column. For example, the metal lines 210*b* and 210*g* are disposed at the top boundary of the memory cell 10_2.

The metal line 210*f* functions as a landing pad of the word line WL_A for the memory cell 10_2, and the metal line 210*a* functions as a landing pad of the word line WL_B for the memory cell 10_2. The landing pad of the word line WL_B is shared by the memory cell adjacent to the memory cell 10_2 in the same row. For example, the metal line 210a is disposed at the left boundary of the memory cell 10_2. The metal lines 210c and 210h function as the landing pads of the VSS line for the memory cell 10_2.

In the first metal layer, the metal lines 210b, 210c and 210d are arranged on a first straight line along the Y direction, and the metal line 210e is arranged on a second straight line along the Y direction. The metal line 210f is arranged on a third straight line along the Y direction. The metal lines 210g, 210h and 210i are arranged on a fourth straight line along the Y direction. The metal line 210j is arranged on a fifth straight line along the Y direction. In such embodiments, the first through fifth straight lines are arranged between the left boundary and the right boundary of the memory cell 10_2 in sequence. Furthermore, only the fifth straight line is disposed over the N-type well region 103a.

The memory cells 10_1 and 10_2 have a rectangular shape with a cell width W1 measurable along the X direction and a cell height H1 measurable along the Y direction. In some embodiments, a memory macro is formed but repeating and abutting memory cells having a configuration identical or mirrored-identical to the memory cells 10_1 and 10_2. Moreover, the cell width W1 is also referred to as a cell pitch along the X direction, and the cell height H1 is also referred to as a cell pitch along the Y direction.

Figure 5A:
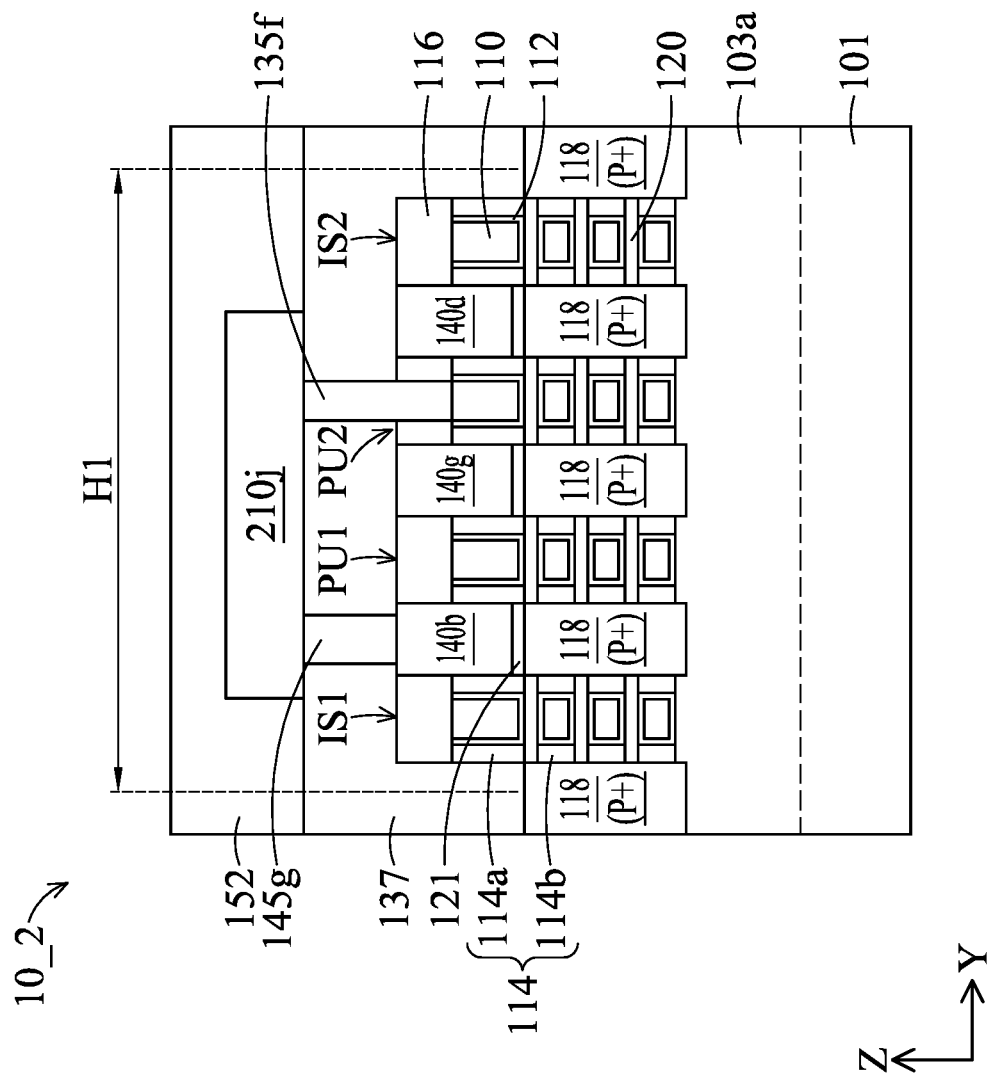
FIG. 5A shows a cross sectional view of the semiconductor device along a line A-A' in FIGS. 4A through 4C, in accordance with some embodiments of the disclosure.

FIG. 5A shows a cross sectional view of the semiconductor device 100A along a line A-A' in FIGS. 4A through 4C, in accordance with some embodiments of the disclosure. As described above, the memory cell 10_2 has a cell height (or cell pitch) H1 measurable in the Y-direction. In FIG. 5A, the cross sectional view of the pull-up transistors PU1 and PU2 and the isolation transistors IS1 and IS2 are illustrated, and the pull-up transistors PU1 and PU2 and the isolation transistors IS1 and IS2 are P-type GAA FETs.

Figure 5B:
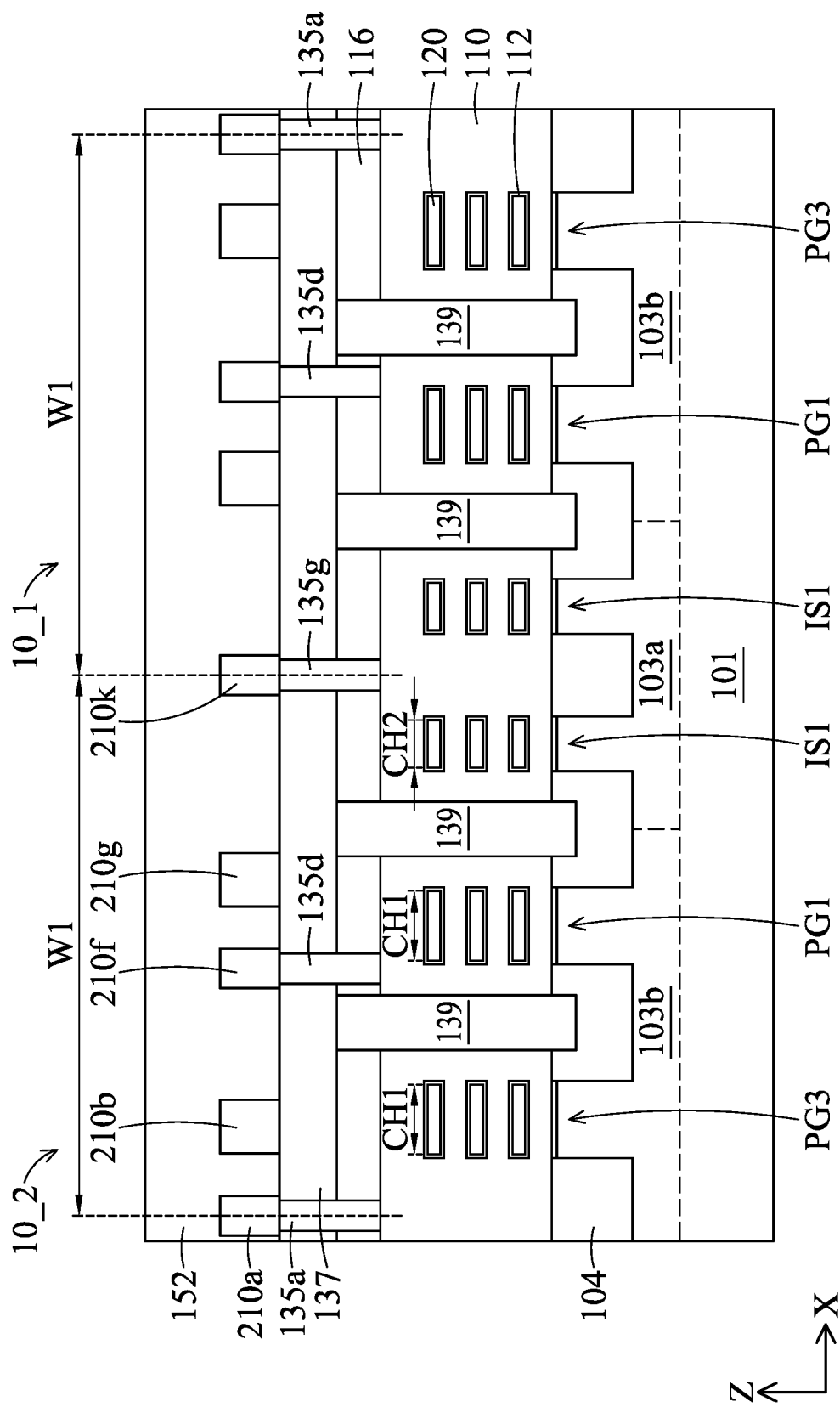
FIG. 5B shows a cross sectional view of the semiconductor device along a line B-B' in FIGS. 4A through 4C, in accordance with some embodiments of the disclosure.

FIG. 5B shows a cross sectional view of the semiconductor device 100A along a line B-B' in FIGS. 4A through 4C, in accordance with some embodiments of the disclosure. In FIG. 5B, the cross sectional view of the pass-gate transistors PG1 and PG3 and the isolation transistor IS1 of the memory cell 10_1 and 10_2 are illustrated, and the pass-gate transistors PG1 and PG2 are N-type GAA FETs, and the isolation transistors IS1 are P-type GAA FETs.

As shown in FIGS. 5A and 5B, the gate top dielectric layers 116 are over the gate structures 130a through 130h, the gate spacers 114, and the nanostructures 120. The material of the gate top dielectric layers 116 is discussed above.

The gate spacers 114 are on sidewalls of the gate structures 130a through 130h, as shown in FIG. 5A. The gate spacers 114 may include the top spacers 114a and the inner spacers 114b. The top spacers 114a are over the nanostructures 120 and on top sidewalls of the gate structures 130a through 130h. The top spacers 114a may include multiple dielectric materials and be selected from a group consist of $SiO_2$, $Si_3N_4$, carbon doped oxide, nitrogen doped oxide, porous oxide, air gap, or a combination thereof. The inner spacers may include a dielectric material having higher K value (dielectric constant) than the top spacers and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof.

The nanostructures 120 are wrapped by the gate structures 130a through 130h to serve as channels or channel layers of the transistors in the memory cell. In FIGS. 5A and 5B, each GAA transistor has three nanostructures 120 vertically arranged (or stacked) in the Z-direction. In other embodiments, each GAA transistor has the more or less nanostructures 120 vertically arranged (or stacked) in the Z-direction, e.g., the number of nanostructures 120 may be 2 to 10.

In the memory cell, the active regions 105a through 105c may have different widths in the X direction. In some embodiments, the widths of the active regions 105a through 105c are determined according to the channel width corresponding to the respective nanostructures 120. As shown in FIG. 5B, the nanostructures 120 of the pass-gate transistors PG1 and PG3 have a channel width CH1 in the X direction, and the nanostructures 120 of the isolation transistors IS1 have a channel width CH2 in the X direction. In such embodiments, the channel width CH2 is less than the channel width CH1 (i.e., CH2<CH1). Moreover, the gate end dielectrics 139 are formed on opposite sides of the gate electrode 110.

Each source/drain feature 118 is disposed between two adjacent gate structures and contact the nanostructures 120 of the transistors, as shown in FIG. 5A. Therefore, each source/drain feature 118 is shared by two adjacent gate structures. In some embodiments, the source/drain features 118 may be also referred to as common source/drain features. As described above, the source/drain features 118 is formed by the epitaxially-grown materials discussed above. For an N-type GAA transistor, the epitaxially-grown materials 118 may include the materials with N-type conductivity, such as SiP, SiC, SiPC, SiAs, Si, or a combination thereof. For a P-type GAA transistor, the epitaxially-grown materials 118 may include the materials with P-type conductivity, such as SiGe, SiGeC, Ge, Si, a boron-doped SiGe, boron and carbon doped SiGe, or a combination thereof.

The silicide features 121 are formed between the source/drain contacts 140a through 140h and the source/drain features 118. The silicide features 121 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

The dielectric feature 137 may be an inter-layer dielectric (ILD), and the dielectric feature 152 may be an inter-metal dielectric (IMD). The dielectric features 137 and 152 may include one or more dielectric layers including dielectric materials, such as tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

In some embodiments, the materials of the source/drain contact, the vias and metal lines in the memory cell are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

In FIG. 5A, the metal line 210j extends in the Y direction and overlap the pull-up transistors PU1 and PU2. The metal line 210j is electrically connected to the source/drain contact 140b through the via 145g and electrically connected to the gate structure (e.g., the gate structure 130c) of the pull-up transistor PU2.

In FIG. 5B, the metal line 210a is electrically connected to the gate structure (e.g., the gate structure 130a) of the pass-gate transistor PG3 through the gate via 135a, the metal line 210f is electrically connected to the gate structure (e.g., the gate structure 130e) of the pass-gate transistor PG1 through the gate via 135d. Furthermore, the metal line 210k is electrically connected to the gate structure (e.g., the gate structure 130g) of the isolation transistor IS1 through the gate via 135g.

Figure 6:
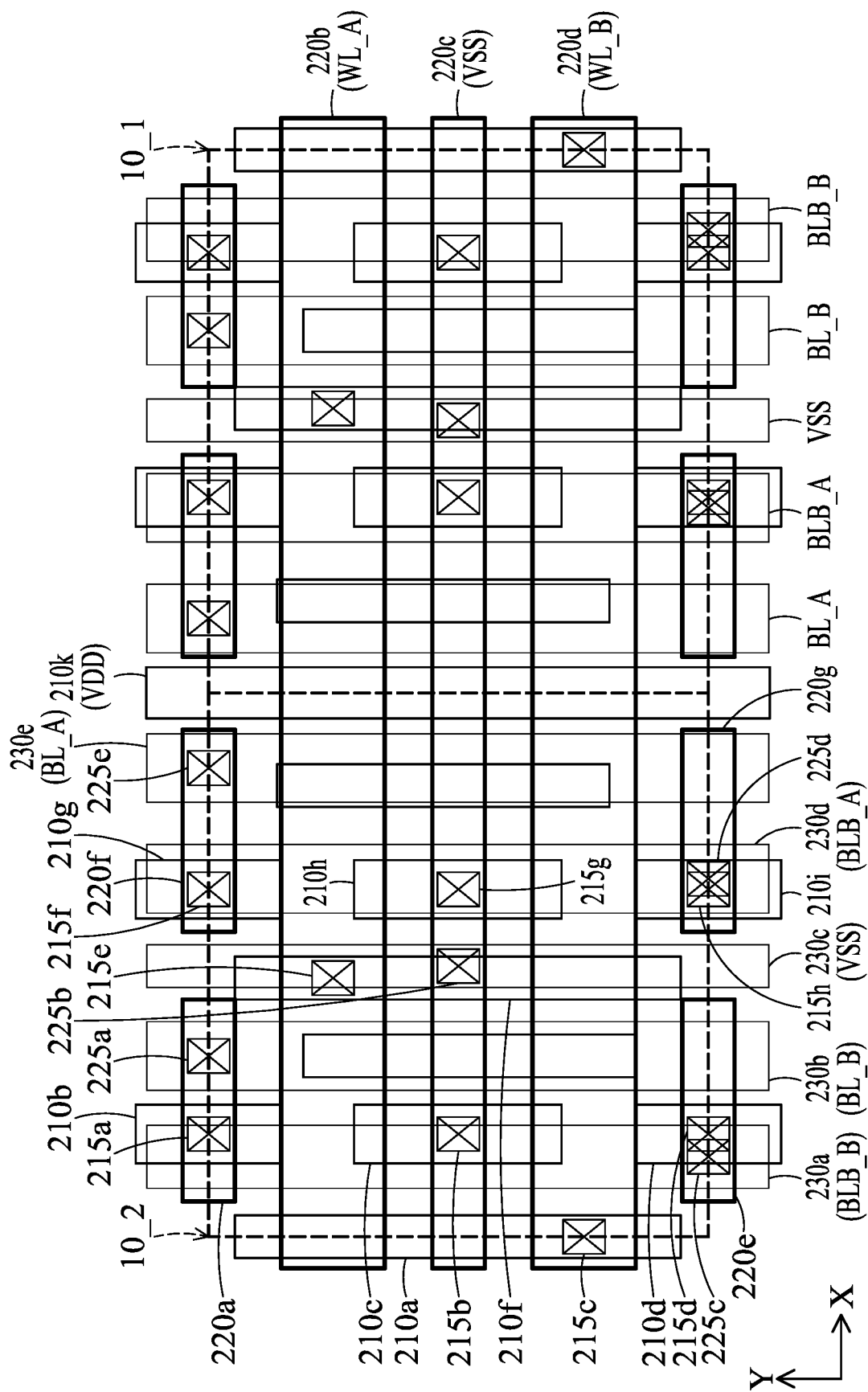
FIG. 6 shows a top view of the semiconductor structure including the memory cells, with depictions of the components between the first and third metal layers, in accordance with some embodiments of the disclosure.

FIG. 6 shows a top view of the semiconductor structure including the memory cells 10_1 and 10_2, with depictions of the components between the first and third metal layers, in accordance with some embodiments of the disclosure. The metal lines 220a through 220g are formed in the second metal layer and extend in the X-direction. The metal lines 230a through 230e are formed in the third metal layer and extend in the Y-direction. As described above, the memory cells 10_1 and 10_2 have a symmetrical configuration. To simplify the description, only the memory cell 10_2 is used for description.

The metal line 220b is electrically connected to the metal line 210f through the via 215e, so as to electrically connect the gate structures of the pass-gate transistors PG2 and PG1. The metal line 220b functions as the word line WL_A for the memory cells 10_1 and 10_2. The metal line 220d is electrically connected to the metal line 210a through the via 215c, so as to electrically connect the gate structures of the pass-gate transistors PG3 and PG4. The metal line 220d functions as the word line WL_B for the memory cells 10_1 and 10_2. The metal line 220c is electrically connected to the metal line 210c through the via 215b and to the metal line 210h through the via 215g, so as to electrically connect the source/drain contact of the pull-down transistors PD1a, PD1b, PD2a and PD2b. The metal line 220c functions as the VSS line for the power mesh of the memory array. Furthermore, the word line WL_B is separated from the word line WL_A by the VSS line in the second metal layer.

The metal line 230a is electrically connected to the metal line 210d through the via 225c, the metal line 220e, and the via 215d in sequence, so as to electrically connect the source/drain contact of the pass-gate transistor PG4. The metal line 230a functions as the complementary bit line BLB_B for the memory cell 10_2. The metal line 230b is electrically connected to the metal line 210b through the via 225a, the metal line 220a, and the via 215a in sequence, so as to electrically connect the source/drain contact of the pass-gate transistor PG3. The metal line 230b functions as the bit line BL_B for the memory cell 10_2. The metal line 230c is electrically connected to the metal lines 210c and 210h through the via 225b, the metal line 220c, and the vias 215b and 215g in sequence, so as to electrically connect the source/drain contact of the pull-down transistors PD1a, PD1b, PD2a and PD2b. The metal line 230c functions as the VSS line for the memory cell 10_2.

The metal line 230d is electrically connected to the metal line 210i through the via 225d, the metal line 220g, and the via 215h in sequence, so as to electrically connect the source/drain contact of the pass-gate transistor PG2. The metal line 230d functions as the complementary bit line BLB_A for the memory cell 10_2. The metal line 230e is electrically connected to the metal line 210g through the via 225e, the metal line 220f, and the via 215f in sequence, so as to electrically connect the source/drain contact of the pass-gate transistor PG1. The metal line 230e functions as the bit line BL_A for the memory cell 10_2.

In the second metal layer, the VSS line is arranged between the word lines WL_A and WL_B, and the word lines WL_A and WL_B are wider than the VSS line. In the third metal layer, the bit line BL_B is arranged between the complementary bit line BLB_B and the VSS line, and the complementary bit line BLB_A is arranged between the bit line BL_A and the VSS line. Moreover, the bit lines BL_A and BL_B and the complementary bit lines BLB_A and BLB_B are wider than the VSS line in the third metal layer.

Figure 7:
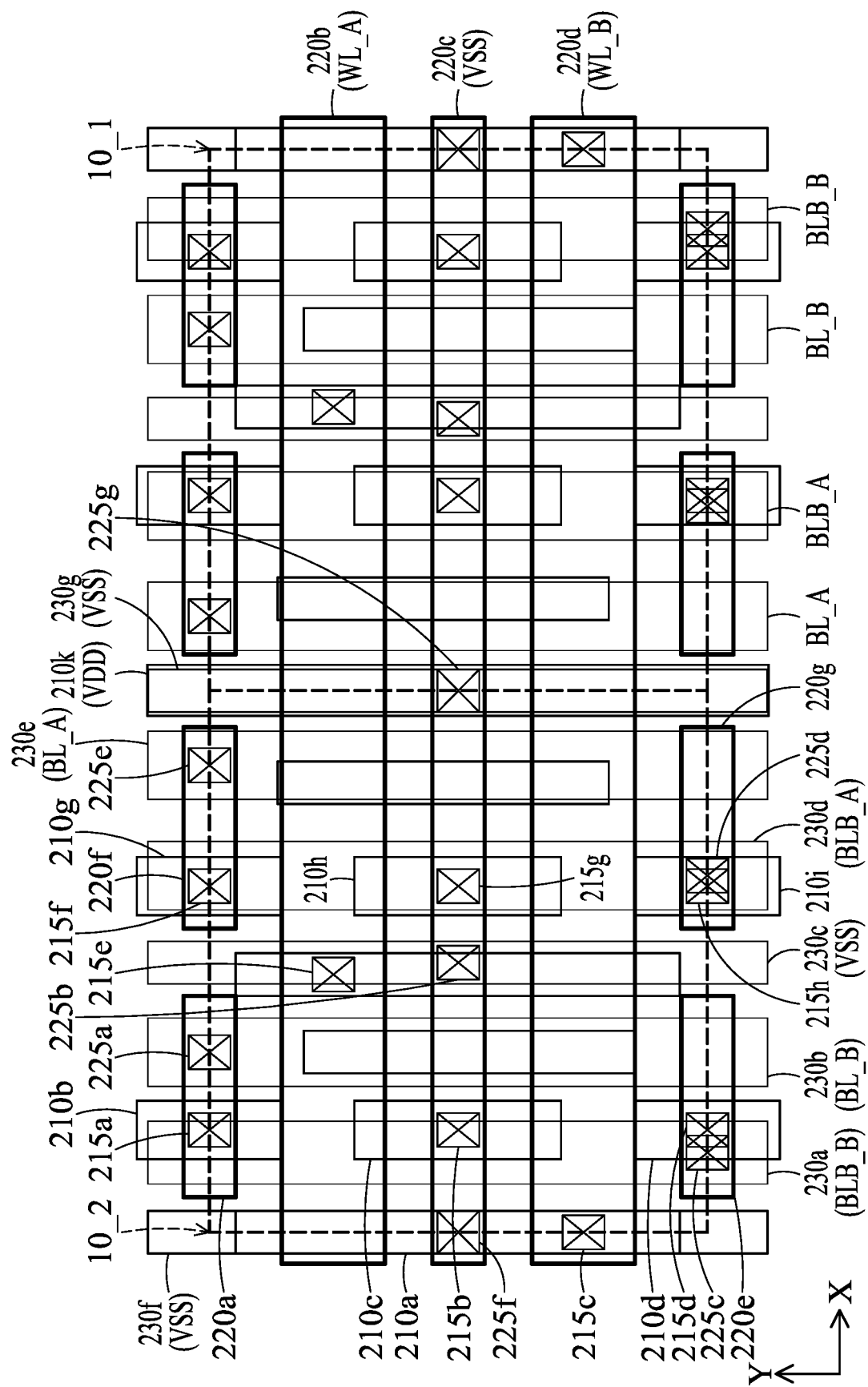
FIG. 7 shows a top view of the semiconductor structure including the memory cells, with depictions of the components between the first and third metal layers, in accordance with some embodiments of the disclosure.

FIG. 7 shows a top view of the semiconductor structure including the memory cells 10_1 and 10_2, with depictions of the components between the first and third metal layers, in accordance with some embodiments of the disclosure. The configuration of the metal lines in FIG. 7 is similar to the configuration of the metal lines in FIG. 6, and the difference between the metal lines of FIG. 6 and the metal lines of FIG. 7 is that the semiconductor structure of FIG. 7 further includes the metal lines 230f and 230g in the third metal layer.

The metal line 230f is electrically connected to the metal line 220c through the via 225f, and the metal line 230g is electrically connected to the metal line 220c through the via 225g. The metal lines 230f and 230g also function as the VSS line for the memory cell 10_2. Therefore, the semiconductor structure of FIG. 7 includes more VSS lines for the power mesh of the memory array.

Figure 8:
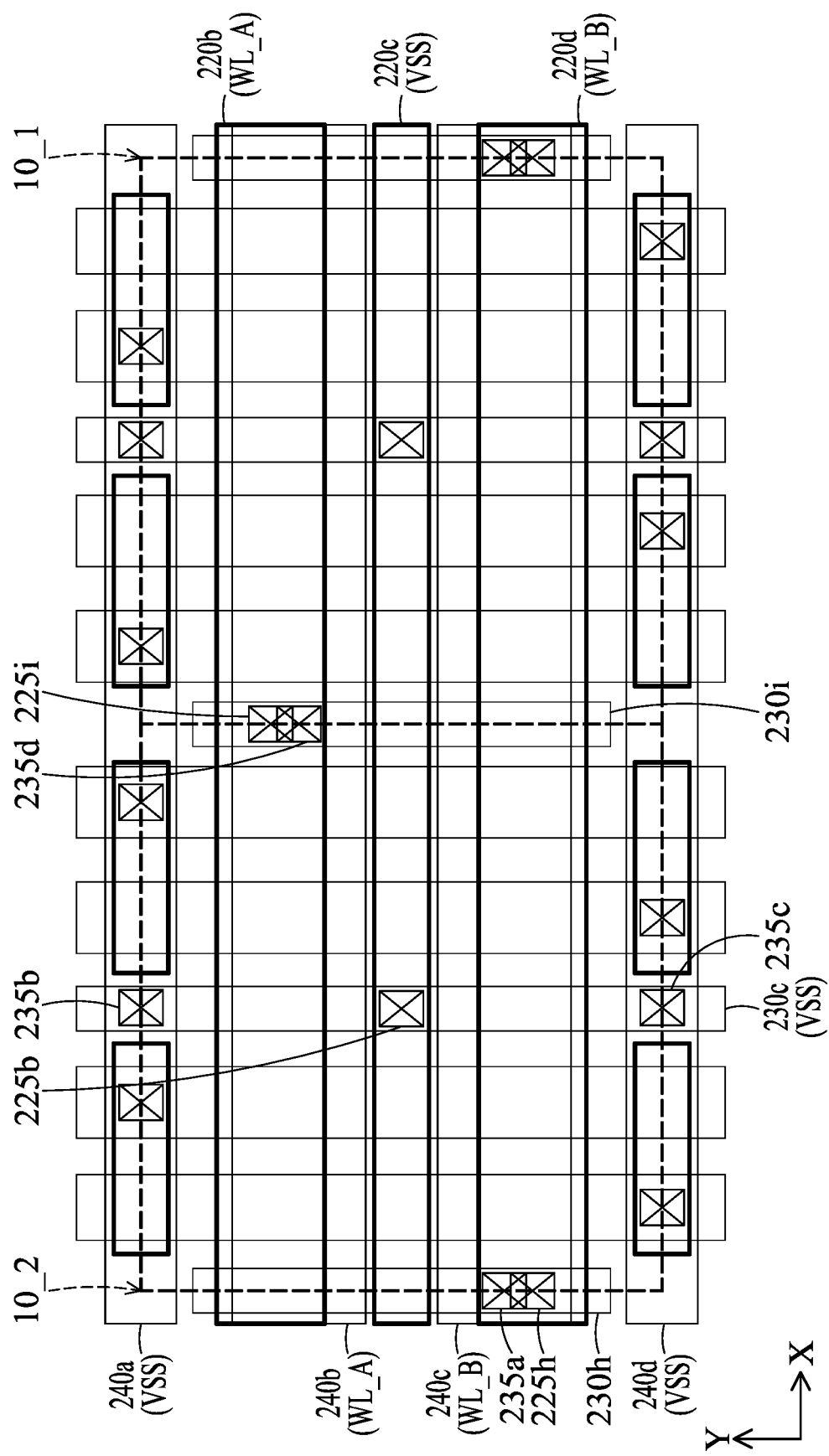
FIG. 8 shows a top view of the semiconductor structure including the memory cells, with depictions of the components in and over the second metal layer, in accordance with some embodiments of the disclosure.

FIG. 8 shows a top view of the semiconductor structure including the memory cells 10_1 and 10_2, with depictions of the components in and over the second metal layer, in accordance with some embodiments of the disclosure. The metal lines 240a through 240d are formed in the fourth metal layer and extend in the X-direction.

The metal line 240a is electrically connected to the metal line 230c through the via 235b, and the metal line 230c is further electrically connected to the metal line 240d through the via 235c. The metal lines 240a and 240d function as the VSS lines for the memory cells 10_1 and 10_2. The metal line 240b is electrically connected to the metal line 220b through the via 235d, the metal line 230i of the third metal layer and the via 225i in sequence. Thus, the metal lines 240b and 220b function as the word line WL_A for the memory cells 10_1 and 10_2. Similarly, the metal line 240c is electrically connected to the metal line 220d through the via 235a, the metal line 230h of the third metal layer and the via 225h in sequence. Thus, the metal lines 240c and 220d function as the word line WL_B for the memory cells 10_1 and 10_2. In FIG. 8, the double word lines WL_A and WL_B (e.g., the word lines in the second and fourth metal layers) are used so as to decrease the resistance of the word lines WL_A and WL_B.

Figure 9:
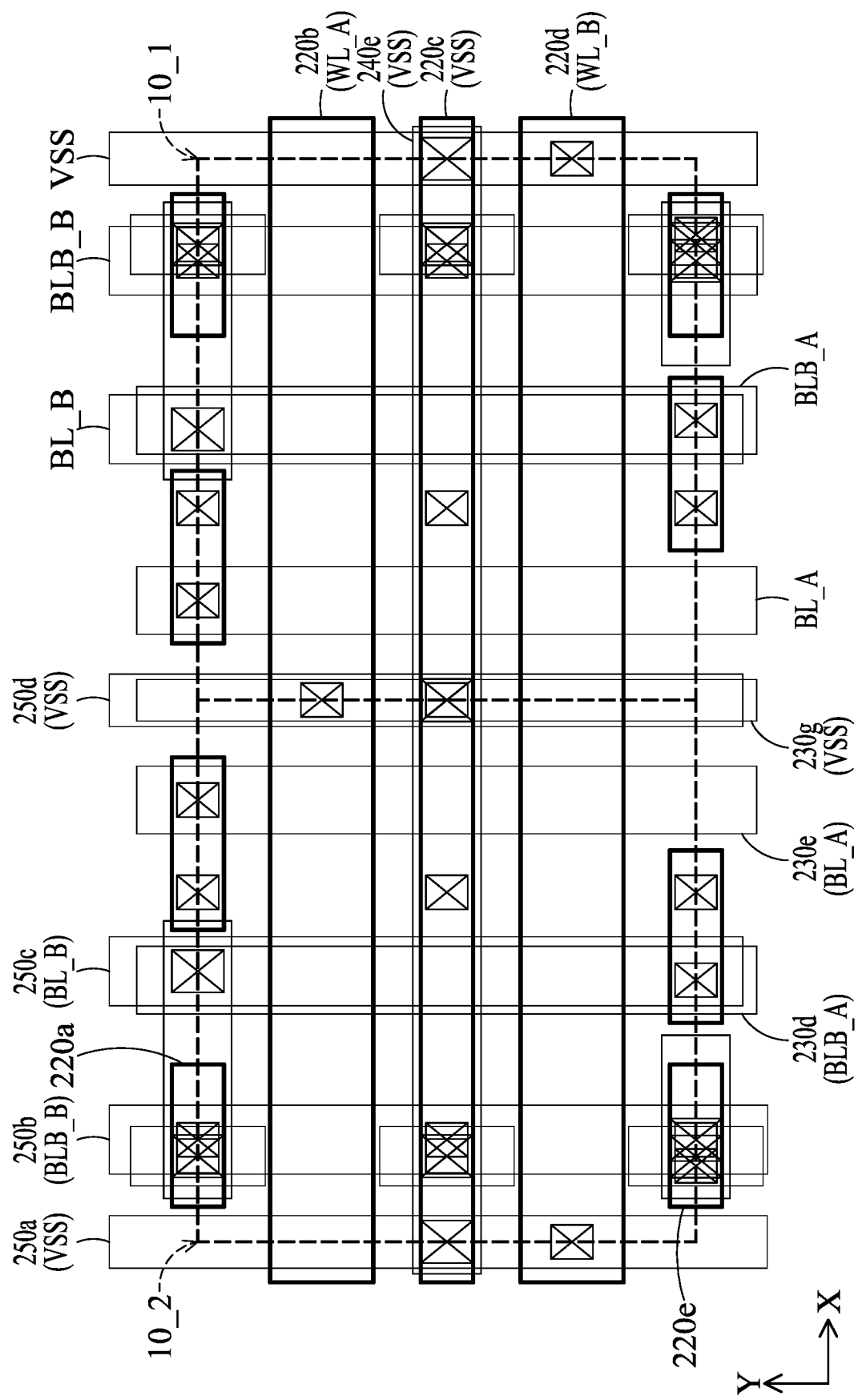
FIG. 9 shows a top view of the semiconductor structure including the memory cells, with depictions of the components in and over the second metal layer, in accordance with some embodiments of the disclosure.

FIG. 9 shows a top view of the semiconductor structure including the memory cells 10_1 and 10_2, with depictions of the components in and over the second metal layer, in accordance with some embodiments of the disclosure. The metal lines 250a through 250d are formed in the fifth metal layer and extend in the Y-direction.

In FIG. 9, the metal lines 250a and 250d are electrically connected the metal line 220c through the corresponding vias and the corresponding landing pads. The metal lines 250a and 250d function as the VSS line for the memory cell 10_2. As described above, the metal line 230d functions as the complementary bit line BLB_A and the metal line 230d functions as the bit line BL_A for the memory cell 10_2. Furthermore, the metal line 250b is electrically connected to the metal line 220e through the corresponding vias and the corresponding landing pads, and the metal line 250c is electrically connected to the metal line 220a through the corresponding vias and the corresponding landing pads. The metal line 250b functions as the complementary bit line BLB_B and the metal line 250c functions as the bit line BL_B for the memory cell 10_2. In such embodiment, the bit line BL_B and the complementary bit line BLB_B are arranged in the fifth metal layer, and the bit line BL_A and the complementary bit line BLB_A are arranged in the third metal layer. Thus, the line widths of the bit lines BL_A and BL_B and the complementary bit lines BLB_A and BLB_B are increased, thereby decreasing the resistance of the bit lines BL_A and BL_B and the complementary bit lines BLB_A and BLB_B.

Figure 10A:
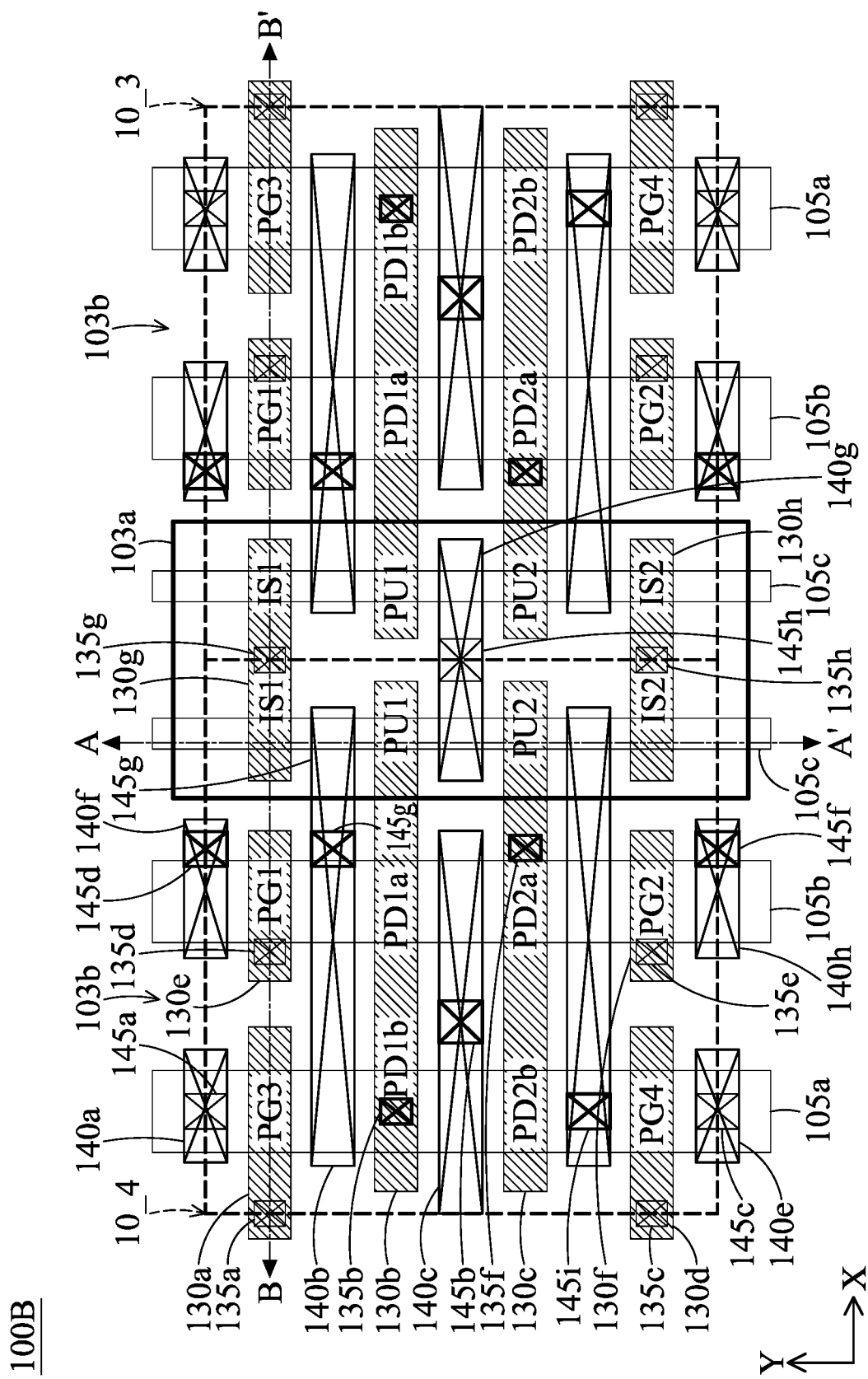
FIG. 10A shows a top view of the memory cells in a semiconductor device, with depictions of the components under the first metal layer of FIG. 3, in accordance with some embodiments of the disclosure.
Figure 10B:
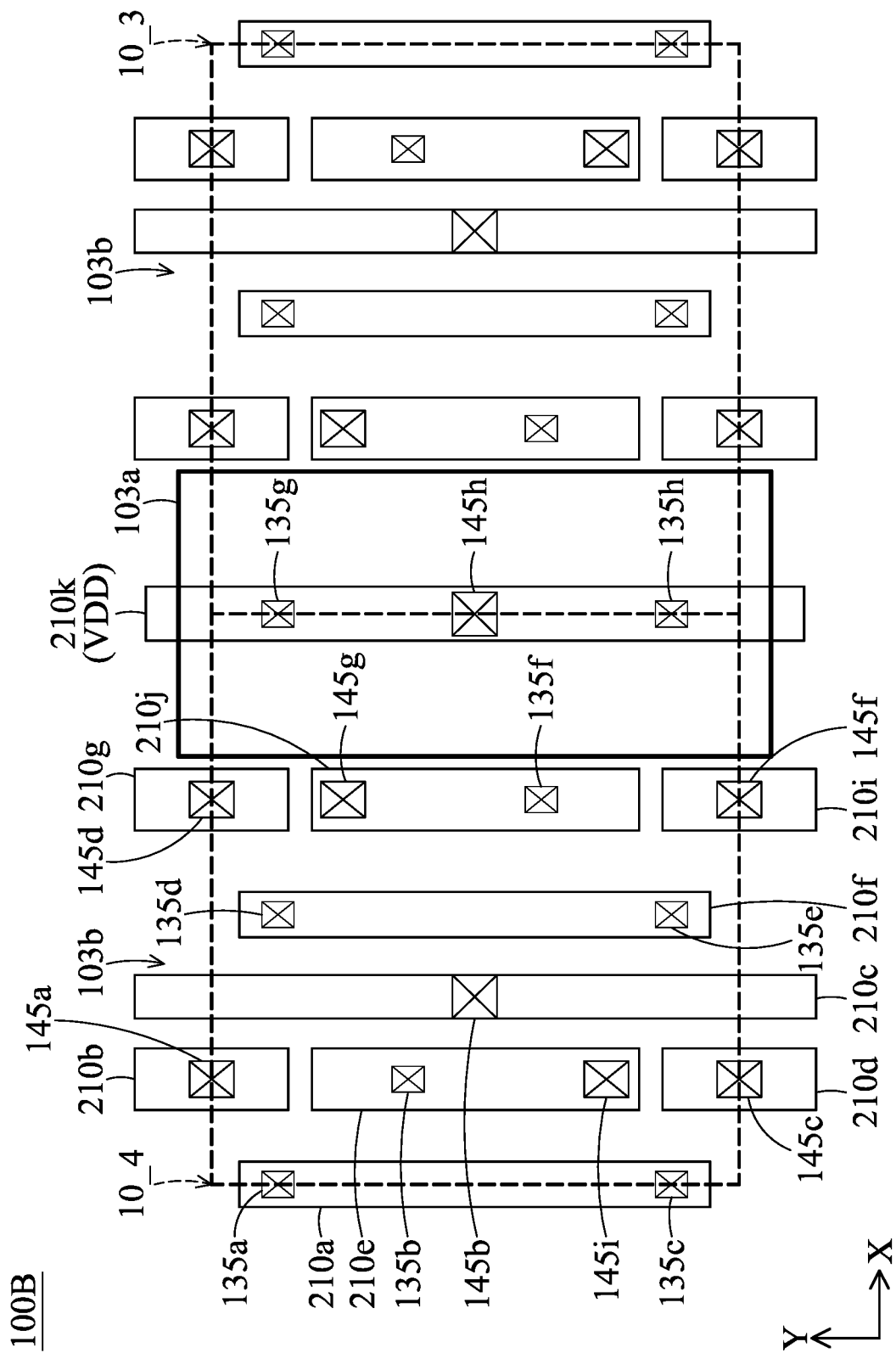
FIG. 10B shows a top view of the memory cells of FIG. 10A, with depictions of the components in the first metal layer.
Figure 10C:
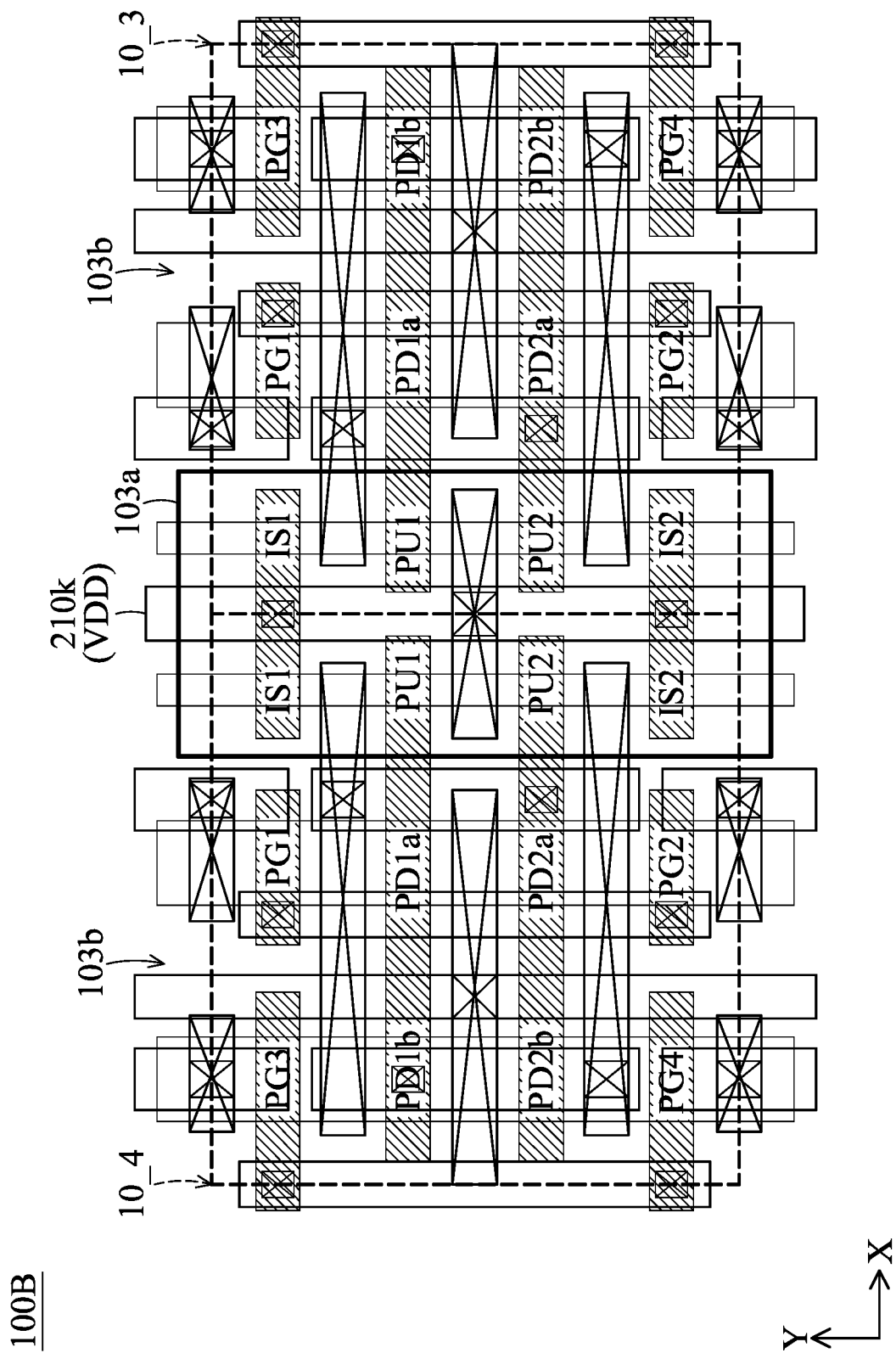
FIG. 10C shows a top view of the memory cells of FIG. 10A, with depictions of the components under and in the first metal layer.

FIG. 10A shows a top view of the memory cells 10_3 and 10_4 in a semiconductor device 100B, with depictions of the components under the first metal layer of FIG. 3, in accordance with some embodiments of the disclosure. FIG. 10B shows a top view of the memory cells 10_3 and 10_4 of FIG. 10A, with depictions of the components in the first metal layer. FIG. 10C shows a top view of the memory cells 10_3 and 10_4 of FIG. 10A, with depictions of the components under and in the first metal layer.

The memory cells 10_3 and 10_4 are an implementation of the dual-port memory cell 10 depicted in FIG. 1. That is, each of the memory cells 10_3 and 10_4 is a 12T SRAM cell with twelve (12) transistors, including two pass-gate transistors PG1 and PG2 of the first port, two pass-gate transistors PG3 and PG4 of the second port, two pull-up transistors PU1 and PU2, fourth pull-down transistors PD1a, PD1b, and PD2a and PD2b, and two isolation transistors IS1 and IS2. In such embodiment, the transistors in the memory cells 10_3 and 10_4 are GAA FETs. The boundaries of the memory cells 10_3 and 10_4 are indicated by dashed lines.

Components in the semiconductor device 100A of FIGS. 4A through 4C that are the same or similar to those in the semiconductor device 100B of FIGS. 10A through 10C are given the same reference numbers, and the detailed description thereof is thus omitted.

The configuration of the semiconductor device 100B in FIG. 10A is similar to the configuration of the semiconductor device 100A in FIG. 4A, and the difference between the semiconductor device 100A of FIG. 4A and the semiconductor device 100B of FIG. 10A is that the locations of the gate vias 135b and 135f and the vias 145b, 145d, 145g, 145i and 145f are changed. Thus, the configuration of the metal lines in the first metal layer are also changed.

In the first metal layer, the metal lines 210b, 210e and 210d are arranged on a first straight line along the Y direction, and the metal line 210c is arranged on a second straight line along the Y direction. The metal line 210f is arranged on a third straight line along the Y direction. The metal lines 210g, 210j and 210i are arranged on a fourth straight line along the Y direction. In such embodiments, the first through fourth straight lines are arranged between the left boundary and the right boundary of the memory cell 10_4 in sequence. Furthermore, the first through fourth straight lines are disposed over the P-type well region 103b. In such embodiment, only the metal line 210k is disposed over (i.e., directly above) the N-type well region 103a in the first metal layer.

Figure 11:
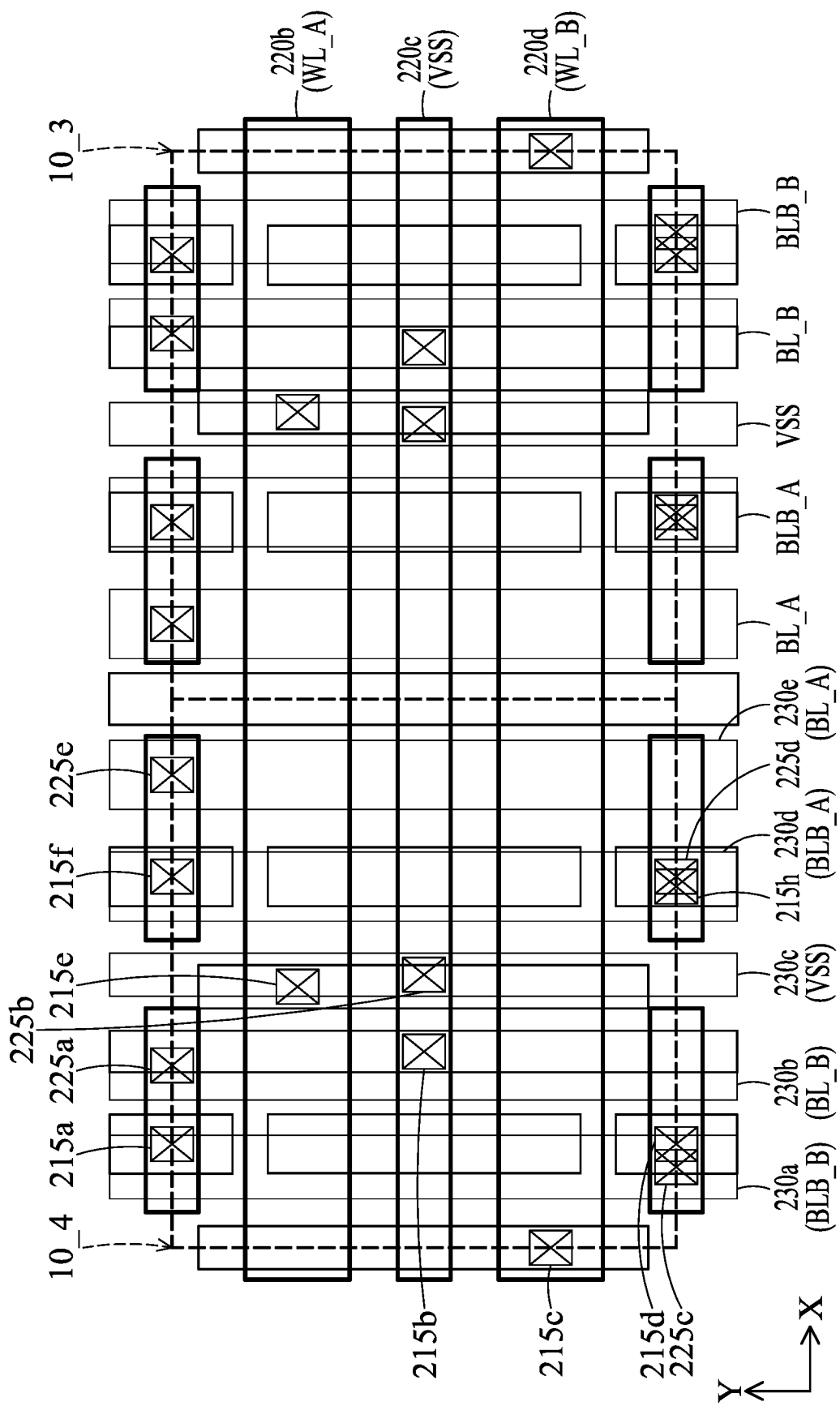
FIG. 11 shows a top view of the semiconductor structure including the memory cells, with depictions of the components between the first and third metal layers, in accordance with some embodiments of the disclosure.

FIG. 11 shows a top view of the semiconductor structure including the memory cells 10_3 and 10_4, with depictions of the components between the first and third metal layers, in accordance with some embodiments of the disclosure. The configuration of the metal lines in the second and third metal layers of FIG. 11 are the same or similar to those in the second and third metal layers of FIG. 6.

In FIG. 11, the bit lines BL_A and BL_B and the complementary bit lines BLB_A and BLB_B are formed in the third metal layer, and the word lines WL_A and WL_B are formed in the second metal layer. In the second metal layer, the VSS line is arranged between the word lines WL_A and WL_B, and the word lines WL_A and WL_B are wider than the VSS line. In the third metal layer, the bit line BL_B is arranged between the complementary bit line BLB_B and the VSS line, and the complementary bit line BLB_A is arranged between the bit line BL_A and the VSS line. Moreover, the bit lines BL_A and BL_B and the complementary bit lines BLB_A and BLB_B are wider than the VSS line in the third metal layer. In some embodiments, the bit lines BL_A and BL_B and the complementary bit lines BLB_A and BLB_B have the same width.

In some embodiments, the semiconductor structure of FIG. 11 includes more VSS lines in the third metal layer for the power mesh of the memory array, such as the metal lines 230f and 230g in FIG. 7. In some embodiments, the double word lines WL_A and WL_B (e.g., the word lines in the second and fourth metal layers in FIG. 8) are used in the semiconductor structure of FIG. 11 so as to decrease the resistance of the word lines WL_A and WL_B. In some embodiments, the bit line BL_B and the complementary bit line BLB_B are arranged on a different metal layer from the bit line BL_A and the complementary bit line BLB_A, as shown in FIG. 9.

Figure 12:
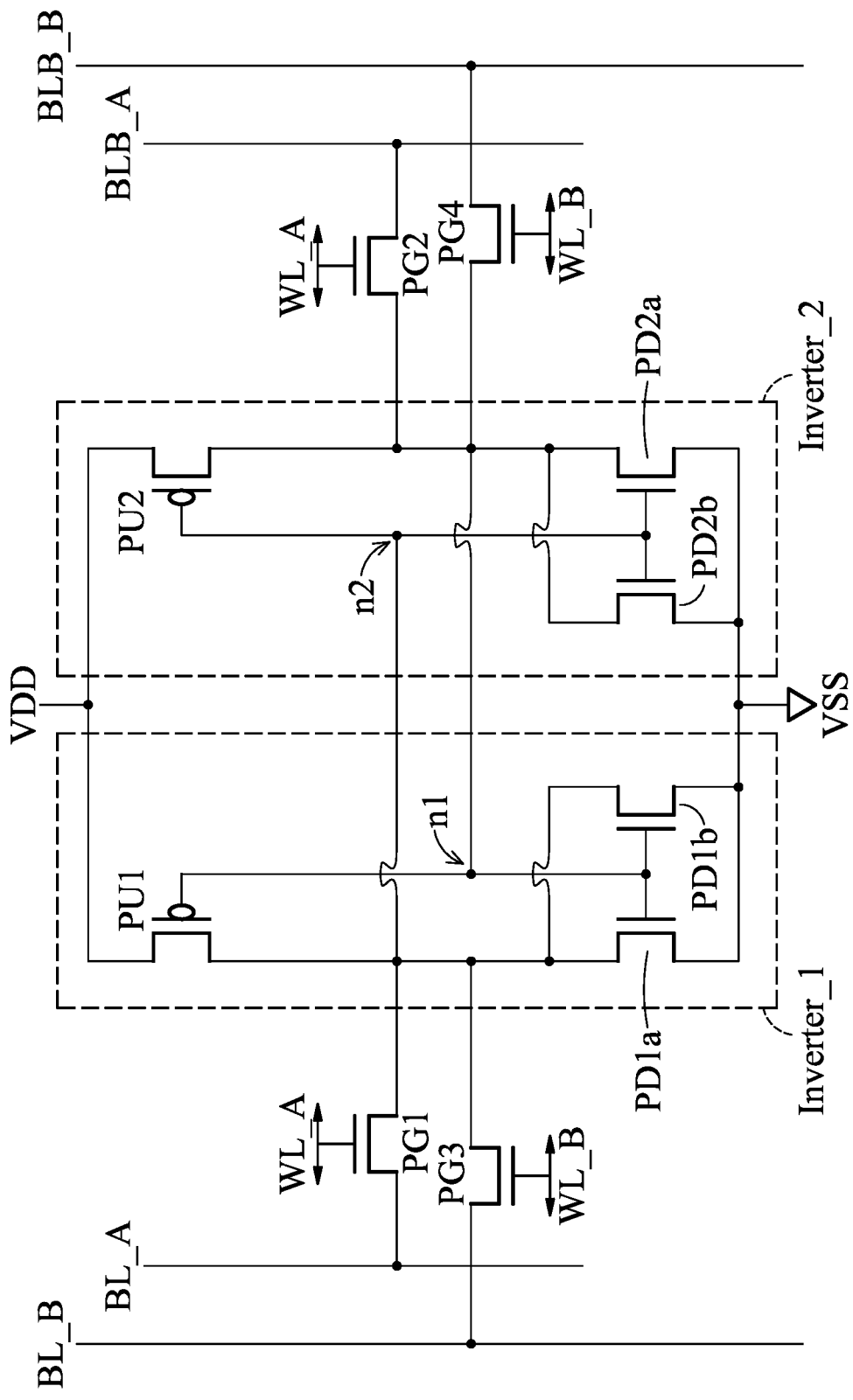
FIG. 12 shows a memory cell, in accordance with some embodiments of the disclosure.

FIG. 12 shows a memory cell 20, in accordance with some embodiments of the disclosure. In this embodiment, the memory cell 20 is a dual-port (DP) SRAM bit cell. The memory cell 20 includes a pair of cross-coupled inverters Inverter-1 and Inverter-2, and the pass-gate transistors PG1, PG2, PG3 and PG4. The inverters Inverter-1 and Inverter-2 are cross-coupled between the data nodes n2 and n1, and form a latch circuit. Compared with the memory cell 10 of FIG. 1, the memory cell 20 is free of the isolation transistors IS1 and IS2.

Figure 13A:
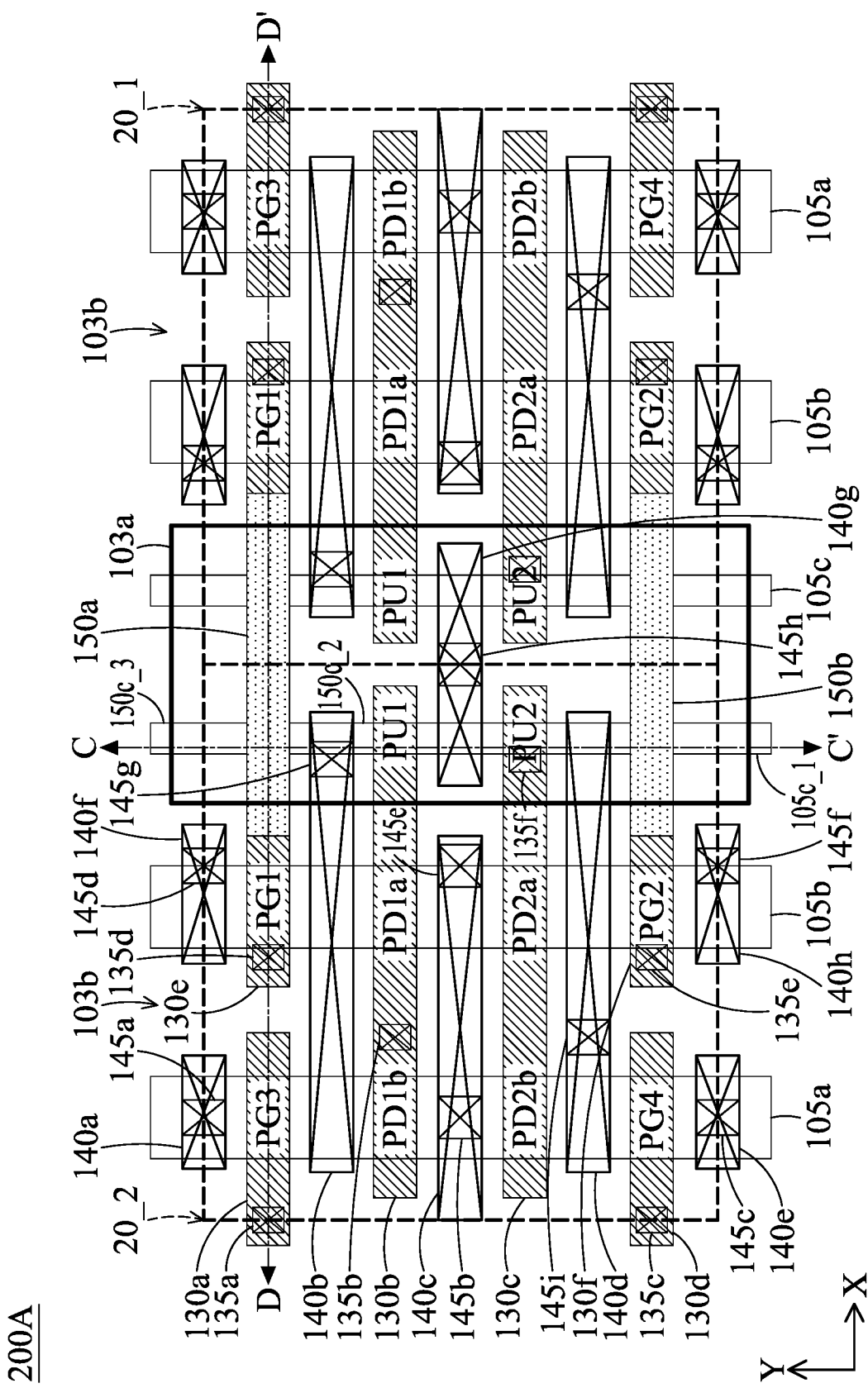
FIG. 13A shows a top view of the memory cells in a semiconductor device, with depictions of the components under the first metal layer of FIG. 3, in accordance with some embodiments of the disclosure.
Figure 13B:
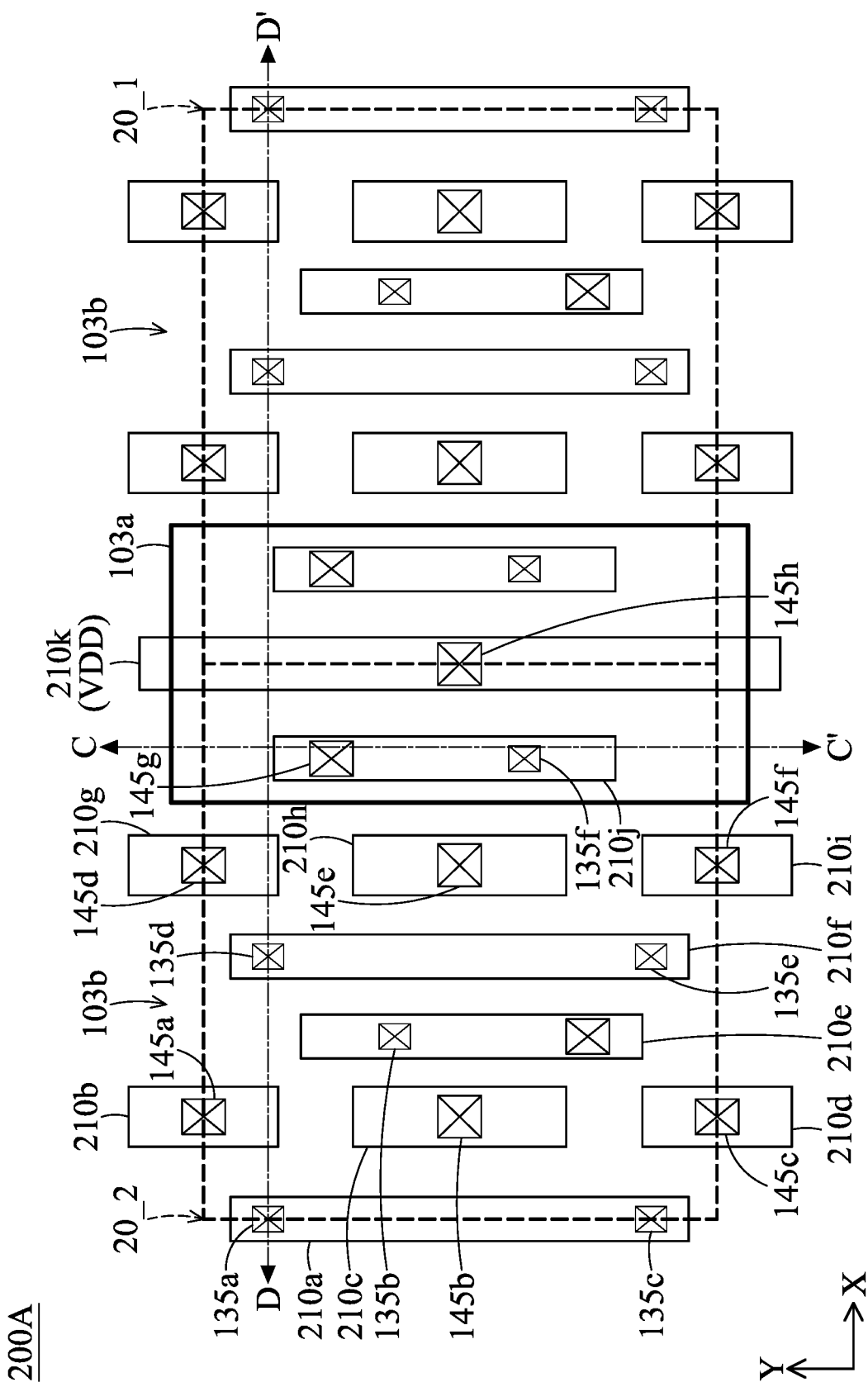
FIG. 13B shows a top view of the memory cells of FIG. 13A, with depictions of the components in the first metal layer.
Figure 13C:
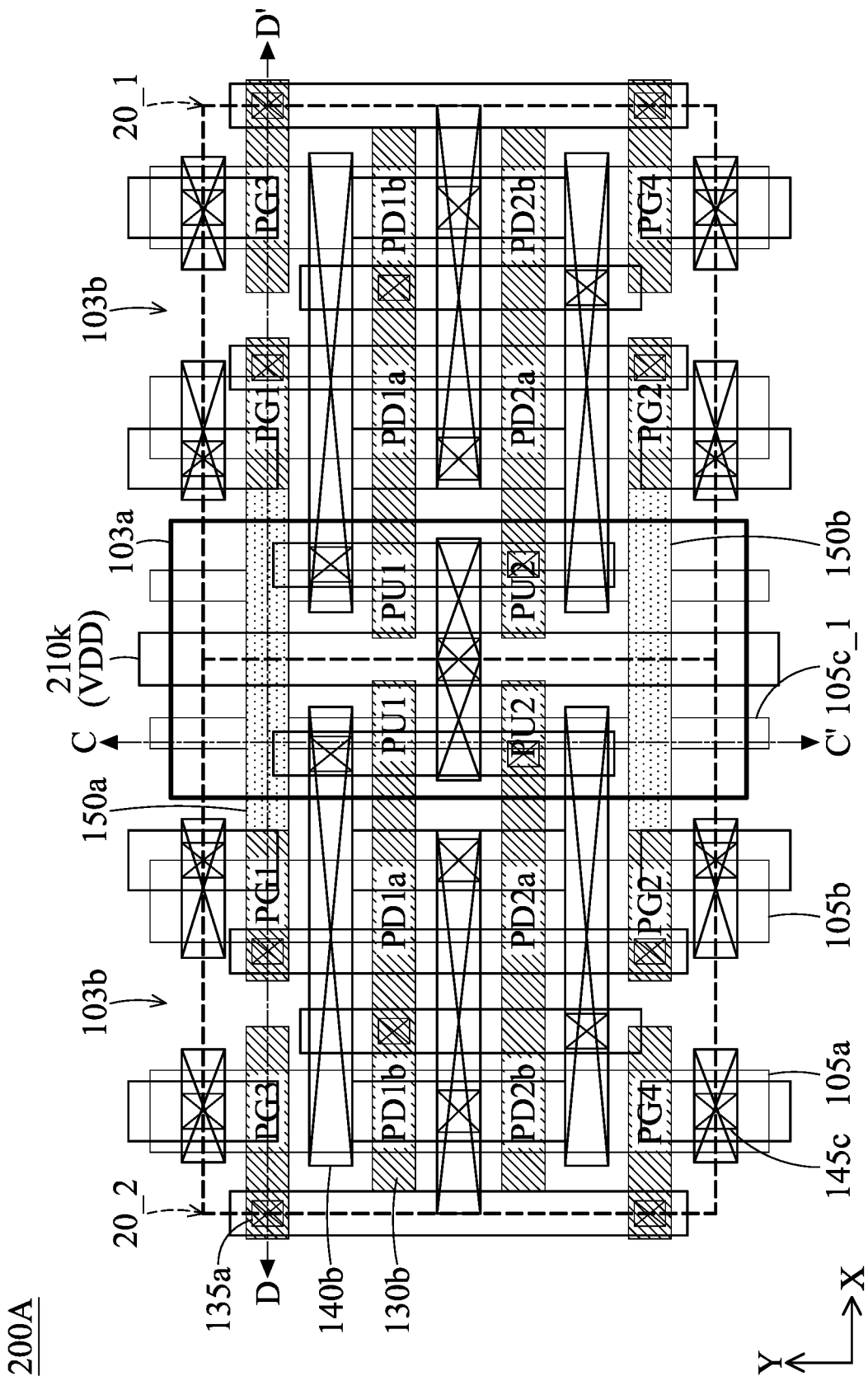
FIG. 13C shows a top view of the memory cells of FIG. 13A, with depictions of the components under and in the first metal layer.

FIG. 13A shows a top view of the memory cells 20_1 and 20_2 in a semiconductor device 200A, with depictions of the components under the first metal layer of FIG. 3, in accordance with some embodiments of the disclosure. FIG. 13B shows a top view of the memory cells 20_1 and 20_2 of FIG. 13A, with depictions of the components in the first metal layer. FIG. 13C shows a top view of the memory cells 20_1 and 20_2 of FIG. 13A, with depictions of the components under and in the first metal layer.

In FIGS. 13A through 13C, the same components in the memory cells 20_1 and 20_2 as the memory cells 10_1 and 10_2 of FIGS. 4A through 4C are given the same reference numbers, and the detailed description thereof is thus omitted. Furthermore, the memory cells 20_1 and 20_2 are arranged in the same row of the memory array, and the memory cell 20_1 is in contact with the adjacent memory cell 20_2.

The memory cells 20_1 and 20_2 are an implementation of the dual-port memory cell 20 depicted in FIG. 12. That is, each of the memory cells 20_1 and 20_2 is a 10T SRAM cell with ten (10) transistors, including two pass-gate transistors PG1 and PG2 of the first port, two pass-gate transistors PG3 and PG4 of the second port, two pull-up transistors PU1 and PU2, and fourth pull-down transistors PD1a, PD1b, and PD2a and PD2b. In such embodiment, the transistors in the memory cells 20_1 and 20_2 are GAA FETs. The boundaries of the memory cells 20_1 and 20_2 are indicated by dashed lines.

The memory cells 20_1 and 20_2 are joined along a center line extending along the Y-direction. In other words, the memory cells 20_1 and 20_2 are arranged in mirror symmetry along the Y-direction. It is noted that the illustration of the cells 20_1 and 20_2 is for the purposes of demonstrating the highly symmetric nature of the SRAM cells of the present disclosure and how two adjacent SRAM cells share the same N-type well region 103a. Thus, device stability and cell matching are improved, so as to increase the chip speed and achieve lower power supply for the memory device.

Each of the SRAM cells 20_1 and 20_2 includes a cell height H1 along the Y direction and a cell width W1 along the X direction. In such embodiment, the cell height H1 spans over a total of 4 gate structures and is measured at about 4 gate pitches. Each gate pitch includes a gate length along the Y direction and a gate spacing between two adjacent gate structures along the Y direction.

In each of the memory cells 20_1 and 20_2, the 10 transistors are formed upon 2 continuous active regions (or oxide definition (OD) regions) and 1 discontinuous active region. Furthermore, each of the memory cells 20_1 and 20_2 includes a substrate (not labeled) having the P-type well region 103b and the N-type well region 103a. Each of the memory cells 20_1 and 20_2 includes the active regions 105a, 105b, 105c_1, 105c_2 and 105c_3 extending along the Y direction. The active regions 105a and 105b are formed in the P-type well region 103b, and the active regions 105c_1, 105c_2 and 105c_3 are formed in the N-type well region 103a. In such embodiments, the active regions 105a and 105b are continuous, and the active regions 105c_1, 105c_2 and 105c_3 are discontinuous. Furthermore, no transistor is formed in the active regions 105c_1 and 105c_3.

The configuration of the semiconductor device 100A in FIGS. 4A through 4C is similar to the configuration of the semiconductor device 200A in FIGS. 13A through 13C, and the difference between the semiconductor device 100A and semiconductor device 200A is that the semiconductor device 200A includes the dielectric gate structures 150a and 150b extending in the X-direction.

The dielectric gate structures 150a and 150b are the isolation structures formed over the N-type well region 103a. The dielectric gate structure 150a is formed between the gate structures 130e of the pass-gate transistors PG1 of the memory cells 20_1 and 20_2. Furthermore, the dielectric gate structure 150a is in contact with the gate structures 130e of the pass-gate transistors PG1 of the memory cells 20_1 and 20_2. The dielectric gate structure 150b is formed between the gate structures 130f of the pass-gate transistors PG2 of the memory cells 20_1 and 20_2. Furthermore, the dielectric gate structure 150b is in contact with the gate structures 130e of the pass-gate transistors PG2 of the memory cells 20_1 and 20_2. The active region 105c_3 is separated from the active region 105c_2 by the dielectric gate structure 150a, and the active region 105c_2 is separated from the active region 105c_1 by the dielectric gate structure 150b. In other words, the active region 105c_2 is surrounded (or sandwiched) by the dielectric gate structures 150a and 150b. The active region 105c_2 with the dielectric gate structures 150a and 150b are used to improve both active line end shrink control problem and LOD effect for the pull-up transistors PU1 and PU2.

In each of the memory cells 20_1 and 20_2, the gate structure 130b engages the active region 105c_2 to form the pull-up transistor PU1, and the gate structure 130c engages the active region 105c_2 to form the pull-up transistor PU2. The pull-up transistors PU1 and PU2 are formed in the discontinuous active region 105c_2.

In some embodiments, the OD break region is formed by the dielectric gate structures 150a and 150b, and the dielectric gate structures 150a and 150b are dummy gate structures configured to break the channel region structure for isolating the drain of the pull-up transistors PU1 and PU2 from the adjacent memory cells. The OD break region is substantially a regular gate length dimension and has a trench depth that is deeper than the bottom channel region of the transistors a range of 15 nm to 150 nm.

Figure 14A:
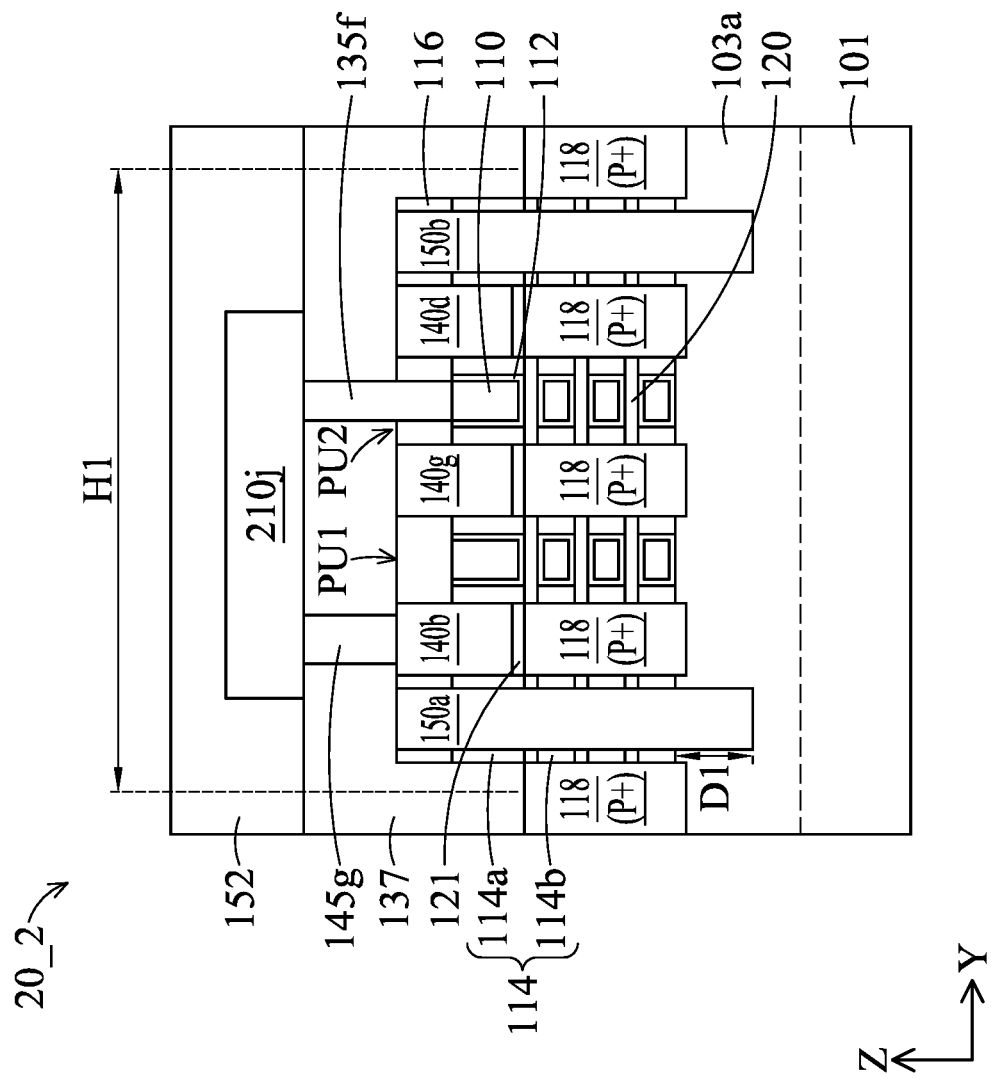
FIG. 14A shows a cross sectional view of the semiconductor device along a line C-C' in FIGS. 13A through 13C, in accordance with some embodiments of the disclosure.

FIG. 14A shows a cross sectional view of the semiconductor device 200A along a line C-C' in FIGS. 13A through 13C, in accordance with some embodiments of the disclosure. As described above, the memory cell 20_2 has a cell height (or cell pitch) H1 measurable in the Y-direction. In FIG. 14A, the cross sectional view of the pull-up transistors PU1 and PU2 are illustrated, and the pull-up transistors PU1 and PU2 are P-type GAA FETs.

Figure 14B:
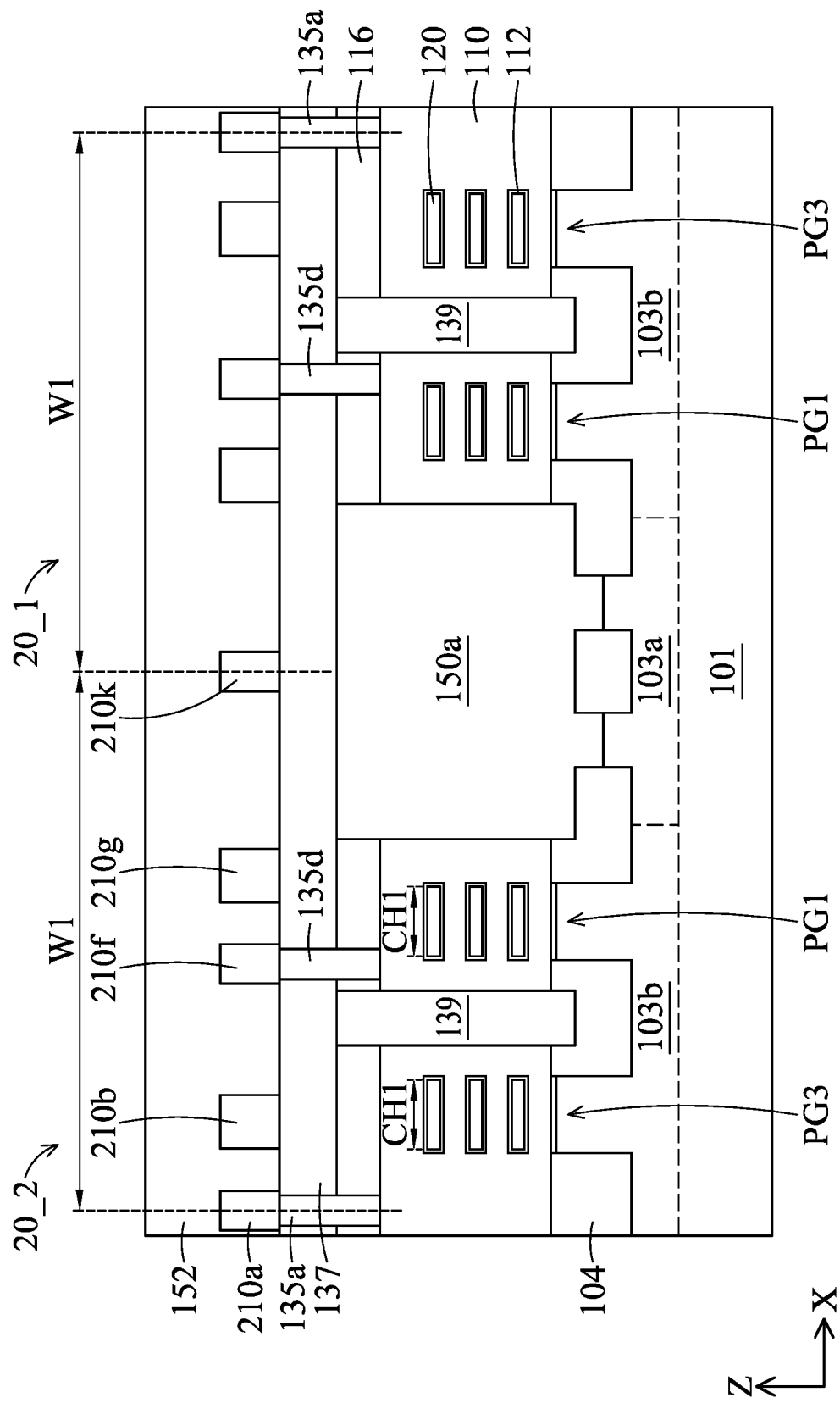
FIG. 14B shows a cross sectional view of the semiconductor device along a line D-D' in FIGS. 13A through 13C, in accordance with some embodiments of the disclosure.

FIG. 14B shows a cross sectional view of the semiconductor device 200A along a line D-D' in FIGS. 13A through 13C, in accordance with some embodiments of the disclosure. In FIG. 14B, the cross sectional view of the pass-gate transistors PG1 and PG3 of the memory cell 20_1 and 20_2 are illustrated, and the pass-gate transistors PG1 and PG2 are N-type GAA FETs.

In FIGS. 14A and 14B, components that are similar to those in FIGS. 5A and 5B will be omitted. In the semiconductor device 200A, the dielectric gate structures 150a and 150b are formed by removing the gate region (e.g., the gate structures 130g and 130h of the semiconductor device 100A) and filling a dielectric material (e.g., a single layer, or multiple layers with various dielectric material) into the N-type well region 103a. In some embodiments, the dielectric gate structures 150a and 150b have the depth D1 that is deeper than the bottom channel region of the transistors about 15 nm~150 nm.

Figure 15:
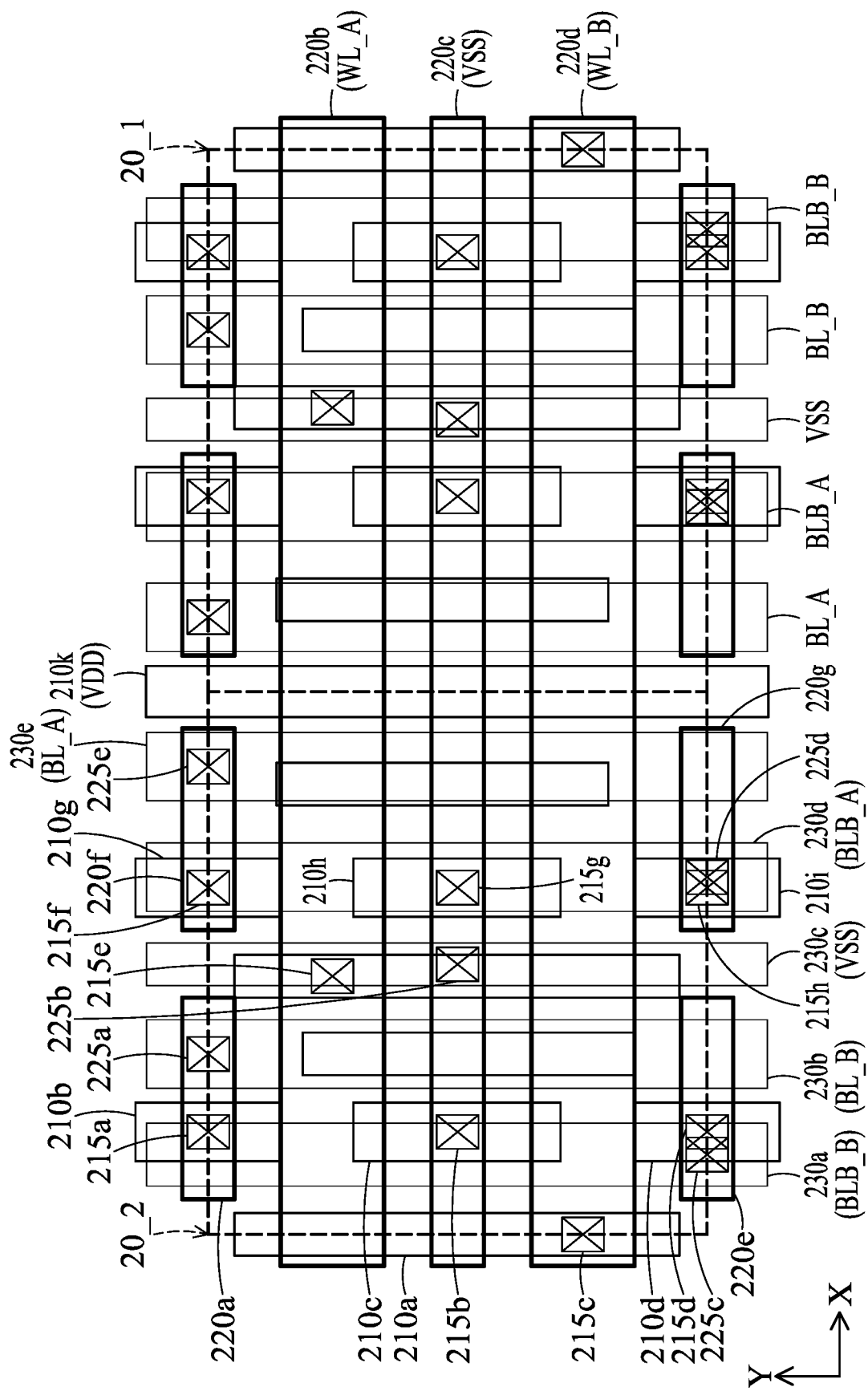
FIG. 15 shows a top view of the semiconductor structure including the memory cells, with depictions of the components between the first and third metal layers, in accordance with some embodiments of the disclosure.

FIG. 15 shows a top view of the semiconductor structure including the memory cells 20_1 and 20_2, with depictions of the components between the first and third metal layers, in accordance with some embodiments of the disclosure. The metal lines 220a through 220g are formed in the second metal layer and extend in the X-direction. The metal lines 230a through 230e are formed in the third metal layer and extend in the Y-direction. As described above, the memory cells 20_1 and 20_2 have a symmetrical configuration.

Components in the semiconductor device 100A of FIG. 6 that are the same or similar to those in the semiconductor device 100B of FIG. 15 are given the same reference numbers, and the detailed description thereof is thus omitted.

In FIG. 15, the bit lines BL_A and BL_B and the complementary bit lines BLB_A and BLB_B are formed in the third metal layer, and the word lines WL_A and WL_B are formed in the second metal layer. In the second metal layer, the VSS line is arranged between the word lines WL_A and WL_B, and the word lines WL_A and WL_B are wider than the VSS line. In the third metal layer, the bit line BL_B is arranged between the complementary bit line BLB_B and the VSS line, and the complementary bit line BLB_A is arranged between the bit line BL_A and the VSS line. Moreover, the bit lines BL_A and BL_B and the complementary bit lines BLB_A and BLB_B are wider than the VSS line in the third metal layer.

In some embodiments, the semiconductor structure of FIG. 15 includes more VSS lines in the third metal layer for the power mesh of the memory array, such as the metal lines 230f and 230g in FIG. 7. In some embodiments, the double word lines WL_A and WL_B (e.g., the word lines in the second and fourth metal layers in FIG. 8) are used in the semiconductor structure of FIG. 11 so as to decrease the resistance of the word lines WL_A and WL_B. In some embodiments, the bit line BL_B and the complementary bit line BLB_B are arranged on a different metal layer from the bit line BL_A and the complementary bit line BLB_A, as shown in FIG. 9.

Figure 16:
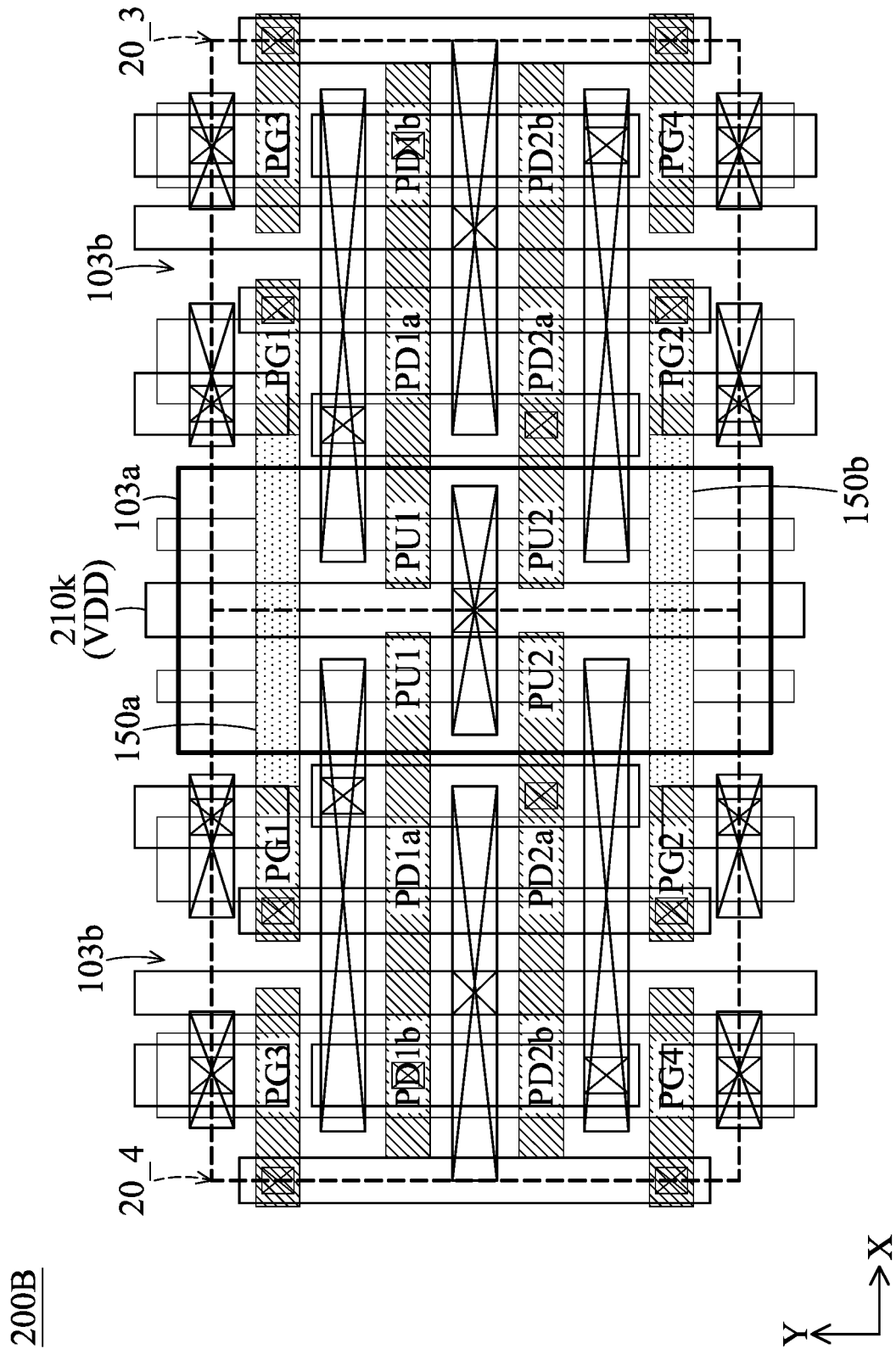
FIG. 16 shows a top view of the memory cells in a semiconductor device, with depictions of the components under and in the first metal layer.

FIG. 16 shows a top view of the memory cells 20_3 and 20_4 in a semiconductor device 200B, with depictions of the components under and in the first metal layer. The memory cells 20_3 and 20_4 are an implementation of the dual-port memory cell 20 depicted in FIG. 12. That is, each of the memory cells 20_3 and 20_4 is a 10T SRAM cell with ten (10) transistors, including two pass-gate transistors PG1 and PG2 of the first port, two pass-gate transistors PG3 and PG4 of the second port, two pull-up transistors PU1 and PU2, and fourth pull-down transistors PD1a, PD1b, and PD2a and PD2b. In such embodiment, the transistors in the memory cells 20_3 and 20_4 are GAA FETs. The boundaries of the memory cells 20_3 and 20_4 are indicated by dashed lines.

Components in the semiconductor device 200A of FIGS. 13A through 13C that are the same or similar to those in the semiconductor device 200B of FIG. 16 are given the same reference numbers, and the detailed description thereof is thus omitted.

The configuration of the semiconductor device 200B in FIG. 16 is similar to the configuration of the semiconductor device 200A in FIG. 10C, and the difference between the semiconductor device 200A of FIG. 10C and the semiconductor device 200B of FIG. 16 is that the configuration of the metal lines in the first metal layer are changed. In such embodiment, only the metal line 210k is disposed over the N-type well region 103a in the first metal layer.

Figure 17:
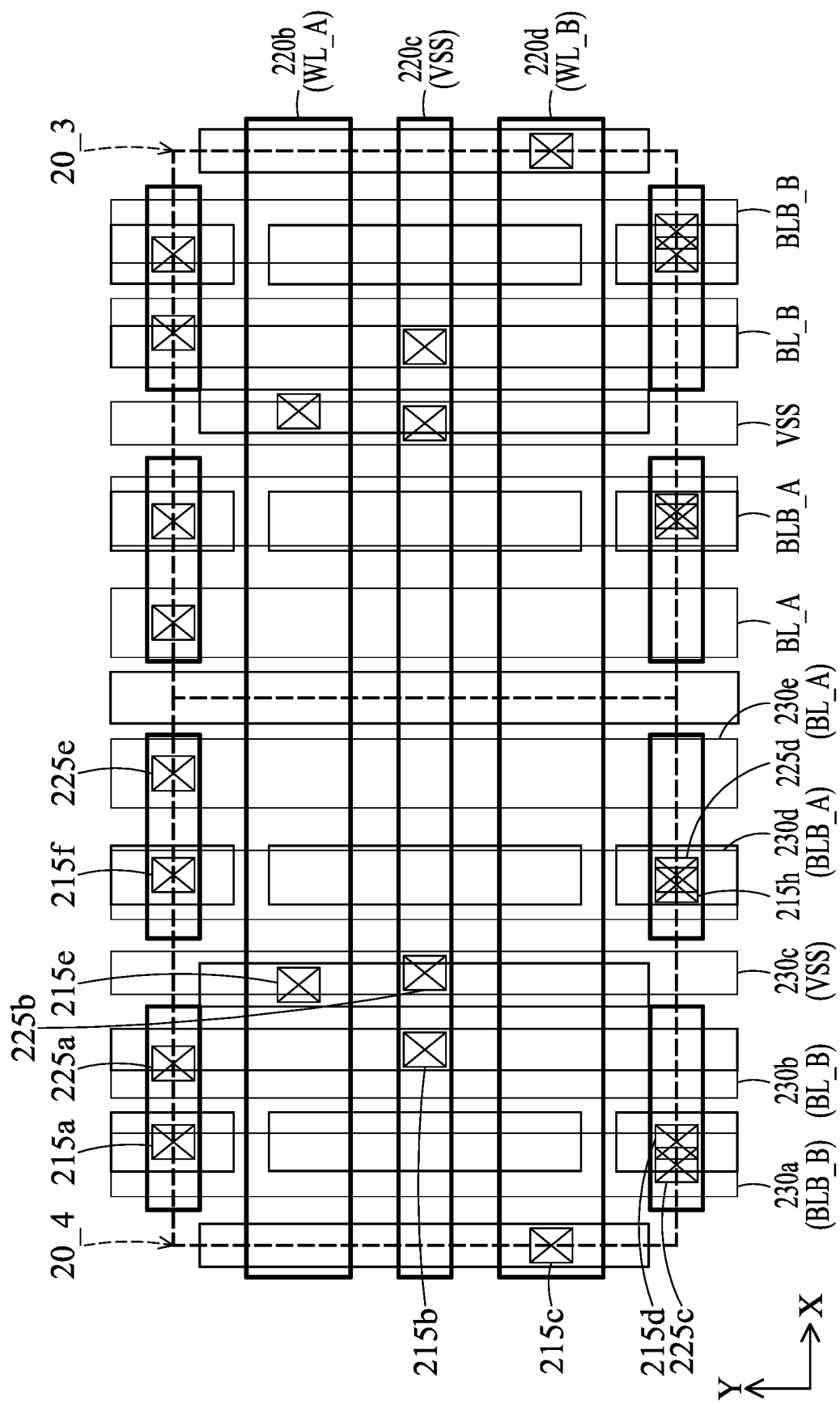
FIG. 17 shows a top view of the semiconductor structure including the memory cells, with depictions of the components between the first and third metal layers, in accordance with some embodiments of the disclosure.

FIG. 17 shows a top view of the semiconductor structure including the memory cells 20_3 and 20_4, with depictions of the components between the first and third metal layers, in accordance with some embodiments of the disclosure. The configuration of the metal lines in the second and third metal layers of FIG. 17 are the same or similar to those in the second and third metal layers of FIG. 15.

In FIG. 17, the bit lines BL_A and BL_B and the complementary bit lines BLB_A and BLB_B are formed in the third metal layer, and the word lines WL_A and WL_B are formed in the second metal layer. In the second metal layer, the VSS line is arranged between the word lines WL_A and WL_B, and the word lines WL_A and WL_B are wider than the VSS line. In the third metal layer, the bit line BL_B is arranged between the complementary bit line BLB_B and the VSS line, and the complementary bit line BLB_A is arranged between the bit line BL_A and the VSS line. Moreover, the bit lines BL_A and BL_B and the complementary bit lines BLB_A and BLB_B are wider than the VSS line in the third metal layer.

In some embodiments, the semiconductor structure of FIG. 11 includes more VSS lines in the third metal layer for the power mesh of the memory array, such as the metal lines 230f and 230g in FIG. 7. In some embodiments, the double word lines WL_A and WL_B (e.g., the word lines in the second and fourth metal layers in FIG. 8) are used in the semiconductor structure of FIG. 11 so as to decrease the resistance of the word lines WL_A and WL_B. In some embodiments, the bit line BL_B and the complementary bit line BLB_B are arranged on a different metal layer from the bit line BL_A and the complementary bit line BLB_A, as shown in FIG. 9.

Figure 18:
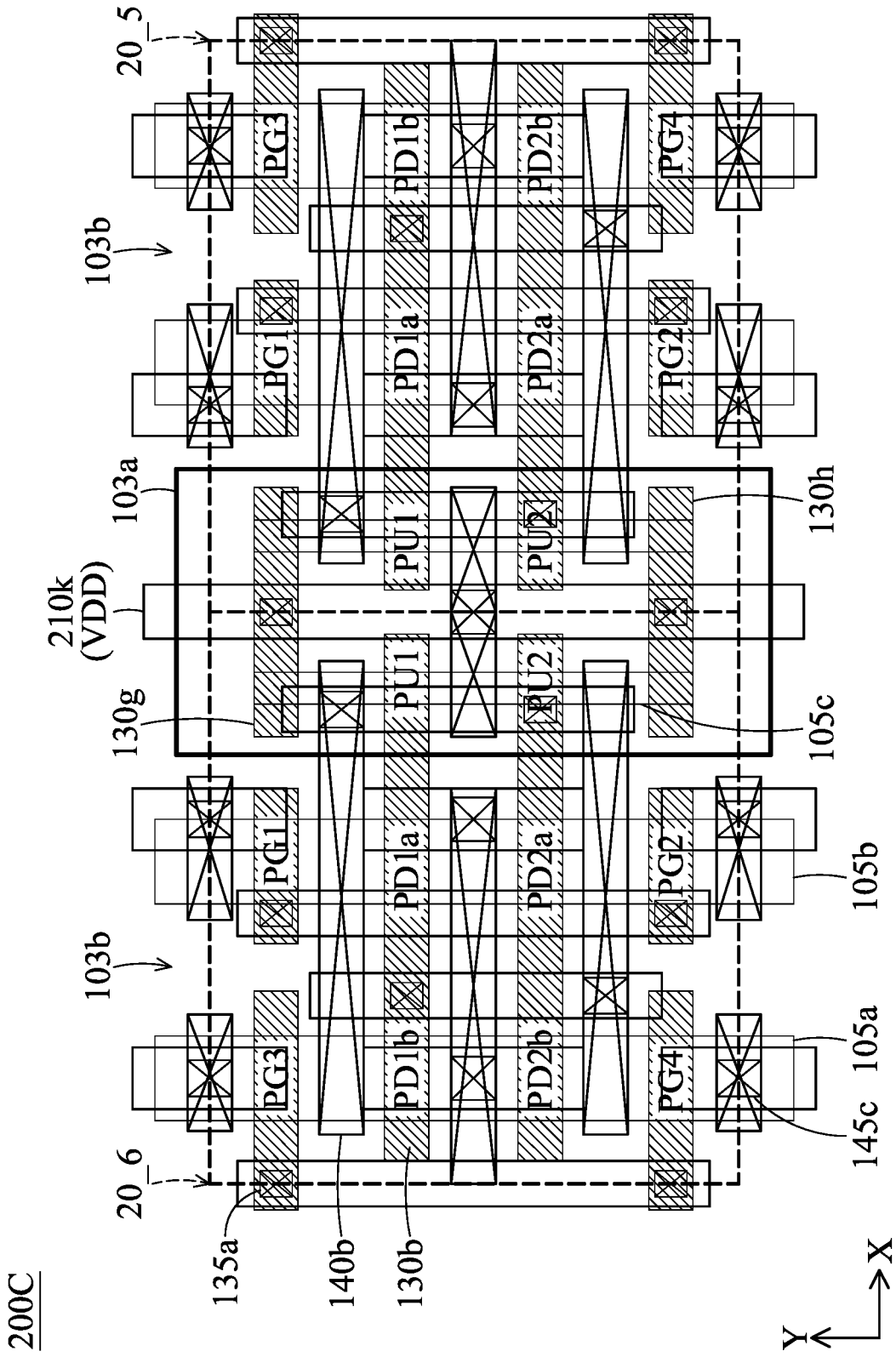
FIG. 18 shows a top view of the memory cells in a semiconductor device, with depictions of the components under and in the first metal layer.

FIG. 18 shows a top view of the memory cells 20_5 and 20_6 in a semiconductor device 200C, with depictions of the components under and in the first metal layer. The memory cells 20_5 and 20_6 are an implementation of the dual-port memory cell 20 depicted in FIG. 12. That is, each of the memory cells 20_5 and 20_6 is a 10T SRAM cell with ten (10) transistors, including two pass-gate transistors PG1 and PG2 of the first port, two pass-gate transistors PG3 and PG4 of the second port, two pull-up transistors PU1 and PU2, and fourth pull-down transistors PD1a, PD1b, and PD2a and PD2b. In such embodiment, the transistors in the memory cells 20_5 and 20_6 are GAA FETs. The boundaries of the memory cells 20_5 and 20_6 are indicated by dashed lines.

In FIG. 18, the same components in the memory cells 20_5 and 20_6 as the memory cells 10_1 and 10_2 of FIGS. 4A through 4C are given the same reference numbers, and the detailed description thereof is thus omitted. Furthermore, the memory cells 20_5 and 20_6 are arranged in the same row of the memory array, and the memory cell 20_5 is in contact with the adjacent memory cell 20_6.

The memory cells 20_5 and 20_6 are an implementation of the dual-port memory cell 20 depicted in FIG. 12. That is, each of the memory cells 20_5 and 20_6 is a 10T SRAM cell with ten (10) transistors, including two pass-gate transistors PG1 and PG2 of the first port, two pass-gate transistors PG3 and PG4 of the second port, two pull-up transistors PU1 and PU2, and fourth pull-down transistors PD1a, PD1b, and PD2a and PD2b. In such embodiment, the transistors in the memory cells 20_5 and 20_6 are GAA FETs. The boundaries of the memory cells 20_5 and 20_6 are indicated by dashed lines.

The memory cells 20_5 and 20_6 are joined along a center line extending along the Y-direction. In other words, the memory cells 20_5 and 20_6 are arranged in mirror symmetry along the Y-direction. It is noted that the illustration of the cells 20_5 and 20_6 is for the purposes of demonstrating the highly symmetric nature of the SRAM cells of the present disclosure and how two adjacent SRAM cells share the same N-type well region 103a. Thus, device stability and cell matching are improved, so as to increase the chip speed and achieve lower power supply for the memory device.

Each of the SRAM cells 20_5 and 20_6 includes a cell height H1 along the Y direction and a cell width W1 along the X direction. In such embodiment, the cell height H1 spans over a total of 4 gate structures and is measured at about 4 gate pitches. Each gate pitch includes a gate length along the Y direction and a gate spacing between two adjacent gate structures along the Y direction.

In each of the memory cells 20_5 and 20_6, the 10 transistors are formed upon 2 continuous active regions (or oxide definition (OD) regions) and 1 discontinuous active region. Furthermore, the active regions 105a and 105b are formed in the P-type well region 103b, and the active regions 105c is formed in the N-type well region 103a. In such embodiments, the active regions 105a and 105b are continuous, and the active region 105c is discontinuous.

The configuration of the semiconductor device 100A in FIGS. 4A through 4C is similar to the configuration of the semiconductor device 200C in FIG. 18, and the difference between the semiconductor device 100A and semiconductor device 200C is that the semiconductor device 200A includes the isolation structures formed by the gate structures 130g and 130h.

In FIG. 18, no metal line is electrically connected to the gate structures 130g and 130h. In some embodiments, the OD break region is formed by the gate structures 130g and 130h, and the gate structures 130g and 130h are dummy gate structures configured to break the source/drain region and located between two dummy gate regions (or two adjacent memory cells) for isolating the drain of the pull-up transistors PU1 and PU2 from the adjacent memory cells. In such embodiments, the gate structures 130g and 130h are disposed over the two opposite sides (or two opposite ends) of the active region 105c.

Embodiments of semiconductor devices are provided. The semiconductor devices include the dual-port memory cells arranged in a memory array. In each dual-port memory cell, the N-type transistors of the first port and a first inverter share a first continuous active region, the N-type transistors of the second port and a second inverter share a second continuous active region, and the P-type transistors share a third continuous active region. Therefore, the fewer active regions and fewer metal lines in each layer are used in the dual-port memory cells, and the dual-port memory cells have highly capability for cell scaling. Furthermore, the word line WL_A and WL_B are arranged in lower metal layer and the bit lines BL_A and BL_B and the complementary bit lines BLB_A and BLB_B are arranged in higher single or multiple metal layers, so as to obtain wider bit line dimension, thereby achieve high density and high speed product requirements for the memory.

In some embodiments, a semiconductor device is provided. The semiconductor device includes a dual-port memory cell. The dual-port memory cell includes a first inverter, a second inverter cross-coupled to the first inverter, first and second pass-gate transistors coupled to the first inverter to form a first port, third and fourth pass-gate transistors coupled to the second inverter to form a second port, a first isolation transistor and a second isolation transistor. The first inverter includes a first pull-up transistor, a first pull-down transistor, and a second pull-down transistor connected in parallel with the first pull-down transistor. The second inverter includes a second pull-up transistor, a third pull-down transistor, and a fourth pull-down transistor connected in parallel with the third pull-down transistor. The first isolation transistor has a drain coupled to the first pull-up transistor and the first and third pass-gate transistors. The second isolation transistor has a drain coupled to the second pull-up transistor and the second and fourth pass-gate transistors. The first and second pass-gate transistors and the first and third pull-down transistors share a first continuous active region extending in a first direction. The third and fourth pass-gate transistors and the second and fourth pull-down transistors share a second continuous active region extending in the first direction. The first and second pull-up transistors and the first and second isolation transistors share a third continuous active region extending in the first direction. The gates of the first and second isolation transistors are electrically connected to a VDD line of a first metal layer extending in the first direction, and the sources of the first and second isolation transistors are floating.

In some embodiments, a semiconductor device is provided. The semiconductor device includes a dual-port memory cell. The dual-port memory cell includes a first inverter, a second inverter, first and second pass-gate transistors coupled to the first inverter to form a first port, third and fourth pass-gate transistors coupled to the second inverter to form a second port. The first inverter includes a first pull-up transistor, a first pull-down transistor, and a second pull-down transistor connected in parallel with the first pull-down transistor. The second inverter includes a second pull-up transistor, a third pull-down transistor, and a fourth pull-down transistor connected in parallel with the third pull-down transistor. The first and second pass-gate transistors and the first and third pull-down transistors share a first continuous active region extending in a first direction. The third and fourth pass-gate transistors and the second and fourth pull-down transistors share a second continuous active region extending in the first direction. The first and second pull-up transistors share a discontinuous active region extending in the first direction. The discontinuous active region is surrounded by a first isolation structure and a second isolation structure extending in a second direction that is perpendicular to the first direction.

In some embodiments, a semiconductor device is provided. The semiconductor device includes a dual-port memory cell. The dual-port memory cell includes a first inverter, a second inverter, first and second pass-gate transistors coupled to the first inverter to form a first port, third and fourth pass-gate transistors coupled to the second inverter to form a second port, and first and second dummy gate structures extending in a second direction that is perpendicular to the first direction. The first inverter includes a first pull-up transistor, a first pull-down transistor, and a second pull-down transistor connected in parallel with the first pull-down transistor. The second inverter includes a second pull-up transistor, a third pull-down transistor, and a fourth pull-down transistor connected in parallel with the third pull-down transistor. The first and second pass-gate transistors and the first and third pull-down transistors share a first continuous active region extending in a first direction. The third and fourth pass-gate transistors and the second and fourth pull-down transistors share a second continuous active region extending in the first direction. The first and second pull-up transistors share a discontinuous active region extending in the first direction. The first and second dummy gate structures are disposed over two opposite sides of the discontinuous active region in the first direction.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
 a dual-port memory cell, comprising:
  a first inverter, comprising a first pull-up transistor, a first pull-down transistor, and a second pull-down transistor connected in parallel with the first pull-down transistor;
  a second inverter cross-coupled to the first inverter, and comprising a second pull-up transistor, a third pull-down transistor, and a fourth pull-down transistor connected in parallel with the third pull-down transistor;
  first and second pass-gate transistors coupled to the first inverter to form a first port;
  third and fourth pass-gate transistors coupled to the second inverter to form a second port;
  a first isolation transistor, having a drain coupled to the first pull-up transistor and the first and third pass-gate transistors; and
  a second isolation transistor, having a drain coupled to the second pull-up transistor and the second and fourth pass-gate transistors, wherein the first and second pass-gate transistors and the first and third pull-down transistors share a first continuous active region extending in a first direction, wherein the third and fourth pass-gate transistors and the second and fourth pull-down transistors share a second continuous active region extending in the first direction, wherein the first and second pull-up transistors and the first and second isolation transistors share a third continuous active region extending in the first direction, wherein gates of the first and second isolation transistors are electrically connected to a VDD line of a first metal layer extending in the first direction, and sources of the first and second isolation transistors are floating.

2. The semiconductor device as claimed in claim 1, wherein the dual-port memory cell further comprises:
a first source/drain contact extending in a second direction that is perpendicular to the first direction, and electrically connected to drains of the first and third pass-gate transistors, the first and second pull-down transistors, the first pull-up transistor and the first isolation transistor; and
a second source/drain contact extending in the second direction, and electrically connected to drains of the second and fourth pass-gate transistors, the third and fourth pull-down transistors, the second pull-up transistor and the second isolation transistor.

3. The semiconductor device as claimed in claim 2, wherein the dual-port memory cell further comprises:
a first gate structure extending in the second direction and across the first, second and third continuous active regions, wherein the first gate structure is shared by the first pull-up transistor and the first and second pull-down transistors;
a second gate structure extending in the second direction and across the first, second and third continuous active regions, wherein the second gate structure is shared by the second pull-up transistor and the third and fourth pull-down transistors,
wherein the first and second gate structures are arranged between the first and second source/drain contacts.

4. The semiconductor device as claimed in claim 1, wherein the dual-port memory cell further comprises:
a first word line landing pad and a second word line landing pad extending in the first direction,
wherein the first word line landing pad is electrically connected to gates of the first and second pass-gate transistors, and the second word line landing pad is electrically connected to gates of the third and fourth pass-gate transistors,
wherein the first and second word line landing pads are formed in the first metal layer.

5. The semiconductor device as claimed in claim 4, wherein the VDD line is disposed at a first cell boundary of the dual-port memory cell, and the second word line landing pad is disposed at a second cell boundary of the dual-port memory cell, wherein the first cell boundary is opposite the second cell boundary, and the first word line landing pad is disposed between the second word line landing pad and the VDD line.

6. The semiconductor device as claimed in claim 1, wherein the first and second continuous active regions are formed in a P-type well region, and the third continuous active region is formed in an N-type well region, wherein a width of the third continuous active region is less than the widths of the first and second continuous active regions in a second direction that is perpendicular to the first direction.

7. The semiconductor device as claimed in claim 6, wherein in the first metal layer, only the VDD line is formed over the N-type well region.

8. The semiconductor device as claimed in claim 1, wherein the dual-port memory cell further comprises:
a first word line formed in a second metal layer over the first metal layer and extending in a second direction that is perpendicular to the first direction;
a second word line formed in the second metal layer and extending in the second direction; and
a VSS line formed in the second metal layer and extending in the second direction,
wherein the first word line is electrically connected to the gates of the first and second pass-gate transistors, and the second word line is electrically connected to the gates of the third and fourth pass-gate transistors,
wherein the VSS line is electrically connected to the sources of the first, second, third and fourth pull-down transistors.

9. The semiconductor device as claimed in claim 8, wherein the first word line is separated from the second word line by the VSS line, and the first and second word lines are wider than the VSS line.

10. The semiconductor device as claimed in claim 1, wherein the dual-port memory cell further comprises:
a first bit line formed in a second metal layer over the first metal layer and extending in the first direction;
a second bit line formed in the second metal layer and extending in the first direction; and
a VSS line formed in the second metal layer and extending in the first direction,
wherein the VSS line is electrically connected to the sources of the first, second, third and fourth pull-down transistors,
wherein the first bit line is electrically connected to the first pass-gate transistor, and the second bit line is electrically connected to the third pass-gate transistor,
wherein the VSS line is disposed between the first and second bit lines, and the first and second bit lines are wider than the VSS line.

11. The semiconductor device as claimed in claim 10, wherein the dual-port memory cell further comprises:
a first complementary bit line formed in the second metal layer and extending in the first direction; and
a second complementary bit line formed in the second metal layer and extending in the first direction,
wherein the first complementary bit line is electrically connected to the second pass-gate transistor, and the second complementary bit line is electrically connected to the fourth pass-gate transistor,
wherein the first complementary bit line is complementary to the first bit line, and the second complementary bit line is complementary to the second bit line,
wherein the second bit line is disposed between the VSS line and the second complementary bit line, and the first complementary bit line is disposed between the VSS line and the first bit line, and the first and second complementary bit lines and the first and second bit lines have the same width.

12. A semiconductor device, comprising:
a dual-port memory cell, comprising:
a first inverter, comprising a first pull-up transistor, a first pull-down transistor, and a second pull-down transistor connected in parallel with the first pull-down transistor;
a second inverter cross-coupled to the first inverter, and comprising a second pull-up transistor, a third pull-down transistor, and a fourth pull-down transistor connected in parallel with the third pull-down transistor;
first and second pass-gate transistors coupled to the first inverter to form a first port; and
third and fourth pass-gate transistors coupled to the second inverter to form a second port;
wherein the first and second pass-gate transistors and the first and third pull-down transistors share a first continuous active region extending in a first direction,
wherein the third and fourth pass-gate transistors and the second and fourth pull-down transistors share a second continuous active region extending in the first direction,
wherein the first and second pull-up transistors share a discontinuous active region extending in the first direction,
wherein the discontinuous active region is surrounded by a first isolation structure and a second isolation structure extending in a second direction that is perpendicular to the first direction.

13. The semiconductor device as claimed in claim 12, wherein each of the first and second isolation structures is formed by a dielectric gate structure.

14. The semiconductor device as claimed in claim 12, wherein the first isolation structure is in contact with a gate structure of the first pass-gate transistor, and the second isolation structure is in contact with a gate structure of the second pass-gate transistor.

15. The semiconductor device as claimed in claim 12, wherein the dual-port memory cell further comprises:
a first source/drain contact extending in the second direction, and electrically connected to drains of the first and third pass-gate transistors, the first and second pull-down transistors, and the first pull-up transistor; and
a second source/drain contact extending in the second direction, and electrically connected to drains of the second and fourth pass-gate transistors, the third and fourth pull-down transistors, and the second pull-up transistor.

16. The semiconductor device as claimed in claim 12, wherein the first and second continuous active regions are formed in a P-type well region, and the discontinuous active region is formed in an N-type well region, wherein a width of the discontinuous active region is less than the widths of the first and second continuous active regions in the second direction.

17. The semiconductor device as claimed in claim 12, wherein the dual-port memory cell further comprises:
a first word line extending in the second direction;
a second word line extending in the second direction; and
a VSS line extending in the second direction,
wherein the first word line, the second word line and the VSS line are formed in the same metal layer,
wherein the first word line is electrically connected to gates of the first and second pass-gate transistors, and the second word line is electrically connected to gates of the third and fourth pass-gate transistors,
wherein the VSS line is electrically connected to sources of the first, second, third and fourth pull-down transistors,
wherein the first word line is separated from the second word line by the VSS line, and the first and second word lines are wider than the VSS line.

18. A semiconductor device, comprising:
a dual-port memory cell, comprising:
a first inverter, comprising a first pull-up transistor, a first pull-down transistor, and a second pull-down transistor connected in parallel with the first pull-down transistor;
a second inverter cross-coupled to the first inverter, and comprising a second pull-up transistor, a third pull-down transistor, and a fourth pull-down transistor connected in parallel with the third pull-down transistor;
first and second pass-gate transistors coupled to the first inverter to form a first port;
third and fourth pass-gate transistors coupled to the second inverter to form a second port; and
first and second dummy gate structures extending in a second direction that is perpendicular to the first direction,
wherein the first and second pass-gate transistors and the first and third pull-down transistors share a first continuous active region extending in a first direction,
wherein the third and fourth pass-gate transistors and the second and fourth pull-down transistors share a second continuous active region extending in the first direction,
wherein the first and second pull-up transistors share a discontinuous active region extending in the first direction,
wherein the first and second dummy gate structures are disposed over two opposite sides of the discontinuous active region in the first direction.

19. The semiconductor device as claimed in claim 18, wherein the dual-port memory cell further comprises:
a first source/drain contact extending in the second direction, and electrically connected to drains of the first and third pass-gate transistors, the first and second pull-down transistors, and the first pull-up transistor; and
a second source/drain contact extending in the second direction, and electrically connected to drains of the second and fourth pass-gate transistors, the third and fourth pull-down transistors, and the second pull-up transistor.

20. The semiconductor device as claimed in claim 19, wherein the dual-port memory cell further comprises:
a first gate structure extending in the second direction and across the first and second continuous active regions and the discontinuous active region, wherein the first gate structure is shared by the first pull-up transistor and the first and second pull-down transistors;
a second gate structure extending in the second direction and across the first and second continuous active regions and the discontinuous active region, wherein the second gate structure is shared by the second pull-up transistor and the third and fourth pull-down transistors,
wherein the first and second gate structures are arranged between the first and second source/drain contacts.

* * * * *